(12) United States Patent
Yu et al.

(10) Patent No.: US 11,380,405 B2
(45) Date of Patent: Jul. 5, 2022

(54) STORAGE DEVICE CALCULATING OPTIMAL READ VOLTAGE USING DEGRADATION INFORMATION

(71) Applicant: SAMSUNG ELECTRONICS CO., LTD., Suwon-si (KR)

(72) Inventors: Jaeduk Yu, Seoul (KR); Jinyoung Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 169 days.

(21) Appl. No.: 16/810,559

(22) Filed: Mar. 5, 2020

(65) Prior Publication Data

US 2021/0043261 A1 Feb. 11, 2021

(30) Foreign Application Priority Data

Aug. 6, 2019 (KR) .................... 10-2019-0095757

(51) Int. Cl.
| | |
|---|---|
| *G11C 29/00* | (2006.01) |
| *G11C 16/26* | (2006.01) |
| *G11C 16/34* | (2006.01) |
| *G11C 16/10* | (2006.01) |
| *G06F 3/06* | (2006.01) |
| *G11C 16/08* | (2006.01) |

(Continued)

(52) U.S. Cl.
CPC ............ *G11C 16/26* (2013.01); *G06F 3/064* (2013.01); *G06F 11/1044* (2013.01); *G11C 16/08* (2013.01); *G11C 16/10* (2013.01); *G11C 16/24* (2013.01); *G11C 16/349* (2013.01)

(58) Field of Classification Search
CPC ......... G11C 16/26; G11C 16/08; G11C 16/10; G11C 16/24; G11C 16/349; G11C 13/0035; G11C 2213/76; G11C 11/005; G11C 11/5642; G11C 13/0004; G11C 13/003; G11C 13/004; G11C 16/0483; G11C 29/42; G06F 3/064; G06F 11/1044; G06F 11/1048; G06F 3/0602; G06F 3/0614; G06F 3/0619
USPC ...................... 714/721, 759, 704, 705, 763
See application file for complete search history.

(56) References Cited

U.S. PATENT DOCUMENTS

| | | | |
|---|---|---|---|
| 9,142,315 B2 * | 9/2015 | Mu .................. | G11C 16/3418 |
| 9,159,437 B2 | 10/2015 | Jeon et al. | |
| 9,164,881 B2 | 10/2015 | Seol et al. | |

(Continued)

*Primary Examiner* — Albert Decady
*Assistant Examiner* — Osman M Alshack
(74) *Attorney, Agent, or Firm* — F. Chau & Associates, LLC

(57) ABSTRACT

A storage device includes a first memory device including a plurality of memory blocks, and a plurality of pages included in each of the plurality of memory blocks, a second memory device configured to store first degradation information of the first memory device, and a controller configured to perform a first read operation on the first memory device using a first read voltage, to acquire the first degradation information, and to perform a second read operation on the first memory device using a second read voltage. The second read voltage is calculated using second degradation information of the first memory device estimated using the first degradation information. Each of the first degradation information and the second degradation information includes the number of error bits of each of the plurality of pages.

18 Claims, 23 Drawing Sheets

(51) Int. Cl.
*G06F 11/10* (2006.01)
*G11C 16/24* (2006.01)

(56) References Cited

U.S. PATENT DOCUMENTS

| | | | |
|---|---|---|---|
| 9,244,763 | B1 | 1/2016 | Kankani et al. |
| 2013/0124944 | A1* | 5/2013 | Eun .................... G06F 11/1072 714/773 |
| 2014/0029351 | A1* | 1/2014 | Mu ...................... G11C 29/021 365/185.22 |
| 2015/0074492 | A1 | 3/2015 | Shono |
| 2016/0104539 | A1* | 4/2016 | Kim ...................... G11C 16/28 365/185.12 |
| 2016/0124679 | A1* | 5/2016 | Huang ................. G11C 16/349 711/103 |
| 2016/0217032 | A1* | 7/2016 | Yum .................... G06F 11/1048 |
| 2017/0287980 | A1* | 10/2017 | Fantini ............... G11C 13/0069 |
| 2018/0090218 | A1* | 3/2018 | Takada ............... G11C 16/0483 |
| 2018/0108422 | A1 | 4/2018 | Oh et al. |
| 2018/0137060 | A1* | 5/2018 | Park .................... G06F 12/0246 |
| 2018/0197608 | A1* | 7/2018 | Song .................... G11C 16/12 |
| 2018/0217769 | A1 | 8/2018 | Nagahara et al. |
| 2018/0217896 | A1 | 8/2018 | Nakazumi et al. |
| 2018/0276073 | A1 | 9/2018 | Ide et al. |
| 2018/0342305 | A1* | 11/2018 | Cha .................... G06F 13/4068 |
| 2019/0079861 | A1 | 3/2019 | Amaki et al. |
| 2019/0362796 | A1* | 11/2019 | Choi .................... G11C 16/26 |
| 2020/0202965 | A1* | 6/2020 | Merritt ................ G11C 29/023 |

* cited by examiner

203A

| | # OF ERROR BITS($N_{m+1}$) | $\Delta V_{READ}$ [V] |
|---|---|---|
| 1st GROUP FOR DEGREE OF DEGRADATION | 10 | −0.125 |
| | 40 | −0.25 |
| | 80 | −0.375 |
| | 120 | −0.5 |
| | ⋮ | ⋮ |
| 2nd GROUP FOR DEGREE OF DEGRADATION | # OF ERROR BITS($N_{m+1}$) | $\Delta V_{READ}$ [V] |
| | 10 | −0.2 |
| | 40 | −0.25 |
| | 80 | −0.3 |
| | 120 | −0.35 |
| | ⋮ | ⋮ |
| ⋮ | ⋮ | ⋮ |
| Nth GROUP FOR DEGREE OF DEGRADATION | # OF ERROR BITS($N_{m+1}$) | $\Delta V_{READ}$ [V] |
| | 10 | −0.35 |
| | 40 | −0.375 |
| | 80 | −0.4 |
| | 120 | −0.425 |
| | ⋮ | ⋮ |

FIG. 13A

| | INCREASE IN NUMBER OF ERROR BITS(ΔN) | $\Delta V_{READ}$ [V] |
|---|---|---|
| 1st GROUP FOR DEGREE OF DEGRADATION | 10 | −0.01 |
| | 20 | −0.025 |
| | 30 | −0.05 |
| | 40 | −0.075 |
| | ⋮ | ⋮ |
| 2nd GROUP FOR DEGREE OF DEGRADATION | INCREASE IN NUMBER OF ERROR BITS(ΔN) | $\Delta V_{READ}$ [V] |
| | 10 | −0.02 |
| | 20 | −0.03 |
| | 30 | −0.04 |
| | 40 | −0.05 |
| | ⋮ | ⋮ |
| ⋮ | ⋮ | ⋮ |
| Nth GROUP FOR DEGREE OF DEGRADATION | INCREASE IN NUMBER OF ERROR BITS(ΔN) | $\Delta V_{READ}$ [V] |
| | 10 | −0.05 |
| | 20 | −0.065 |
| | 30 | −0.08 |
| | 40 | −0.095 |
| | ⋮ | ⋮ |

| | GROUPS OF ERROR BITS | $\Delta V_{READ}$ [V] |
|---|---|---|
| 1st GROUP FOR DEGREE OF DEGRADATION | A1 ($30 \leq N_m+1 < 50$) | −0.4 |
| | B1 ($50 \leq N_m+1 < 70$) | −0.425 |
| | C1 ($70 \leq N_m+1 < 90$) | −0.45 |
| | D1 ($90 \leq N_m+1 < 110$) | −0.475 |
| | ⋮ | ⋮ |

| | GROUPS OF ERROR BITS | $\Delta V_{READ}$ [V] |
|---|---|---|
| 2nd GROUP FOR DEGREE OF DEGRADATION | A2 ($30 \leq N_m+1 < 50$) | −0.45 |
| | B2 ($50 \leq N_m+1 < 70$) | −0.5 |
| | C2 ($70 \leq N_m+1 < 90$) | −0.55 |
| | D2 ($90 \leq N_m+1 < 110$) | −0.6 |
| | ⋮ | ⋮ |

⋮

| | GROUPS OF ERROR BITS | $\Delta V_{READ}$ [V] |
|---|---|---|
| Nth GROUP FOR DEGREE OF DEGRADATION | A3 ($30 \leq N_m+1 < 50$) | −0.6 |
| | B3 ($50 \leq N_m+1 < 70$) | −0.65 |
| | C3 ($70 \leq N_m+1 < 90$) | −0.7 |
| | D3 ($90 \leq N_m+1 < 110$) | −0.75 |
| | ⋮ | ⋮ |

FIG. 13C

STORAGE DEVICE CALCULATING OPTIMAL READ VOLTAGE USING DEGRADATION INFORMATION

CROSS-REFERENCE TO RELATED APPLICATION

This application claims priority under 35 U.S.C. § 119 to Korean Patent Application No. 10-2019-0095757, filed on Aug. 6, 2019 in the Korean Intellectual Property Office, the disclosure of which is incorporated by reference herein in its entirety.

TECHNICAL FIELD

Exemplary embodiments of the present inventive concept relate to a storage device calculating optimal read voltage using degradation information.

DISCUSSION OF RELATED ART

A memory device may experience performance degradation due to various factors, such as an increase in retention time, occurrence of a read disturb error, a decrease in endurance due to increased program/erase (P/E) cycles, or the like. Read margins decrease as the degree of integration of a memory device increases, and a degree of decrease in the read margins increases as the performance degradation of the memory device worsens, which negatively affects data reliability.

SUMMARY

According to an exemplary embodiment of the present inventive concept, a storage device includes a first memory device including a plurality of memory blocks, and a plurality of pages included in each of the plurality of memory blocks, a second memory device configured to store first degradation information of the first memory device, and a controller configured to perform a first read operation on the first memory device using a first read voltage, to acquire the first degradation information, and to perform a second read operation on the first memory device using a second read voltage. The second read voltage is calculated using second degradation information of the first memory device estimated using the first degradation information. Each of the first degradation information and the second degradation information includes the number of error bits of each of the plurality of pages.

According to an exemplary embodiment of the present inventive concept, a storage device includes a first memory device configured to store data requested by a host, a second memory device configured to store first degradation information of the first memory device in page units, and a controller configured to perform a first read operation on the first memory device using a first read voltage, and to acquire the first degradation information. The second memory device estimates second degradation information of the first memory device based on the first degradation information, and calculates a second read voltage, used to perform a second read operation on the first memory device according to a request of the host, based on the second degradation information.

According to an exemplary embodiment of the present inventive concept, a storage device includes a first memory device configured to store data requested by a host, a second memory device configured to store first degradation information of the first memory device, and a controller configured to detect the number of error bits generated by a first read operation on the first memory device as the first degradation information. The first memory device estimates second degradation information of the first memory device, based on the first degradation information, in response to a request of a second read operation from the host, and uses a read voltage calculated based on the second degradation information to perform the second read operation. A program unit of the second memory device is different from a program unit of the first memory device.

BRIEF DESCRIPTION OF DRAWINGS

The above and other aspects and features of the present inventive concept will be more clearly understood by describing in detail exemplary embodiments thereof with reference to the accompanying drawings.

FIGS. 13A to 13C are views illustrating a lookup table according to exemplary embodiments of the present inventive concept.

DETAILED DESCRIPTION OF THE EXEMPLARY EMBODIMENTS

Figure 1:
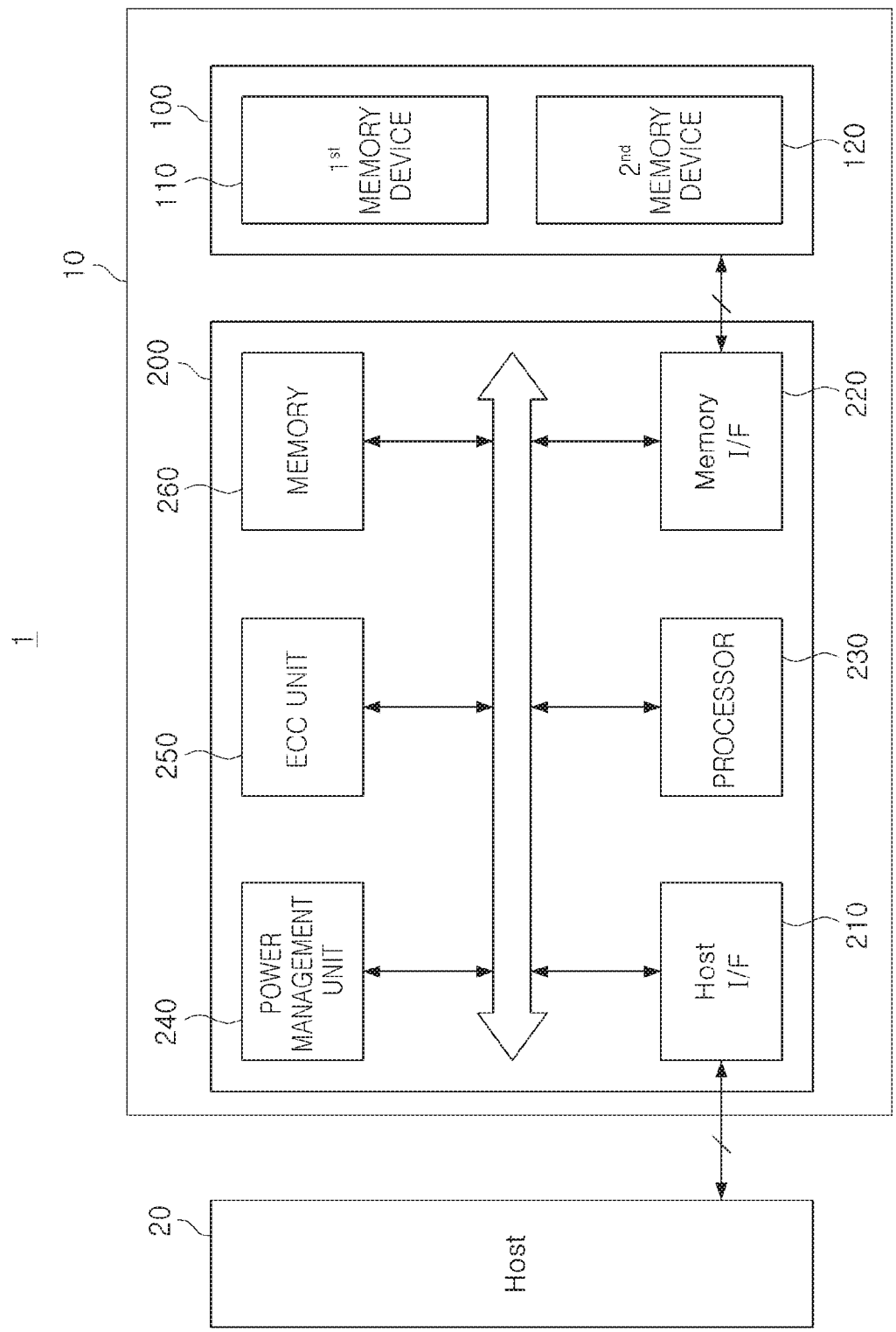
FIG. 1 is a view illustrating a storage system according to an exemplary embodiment of the present inventive concept.

Exemplary embodiments of the present inventive concept provide a storage device capable of effectively controlling read voltages using degradation information stored in heterogeneous memory devices.

Hereinafter, exemplary embodiments of the present inventive concept will be described in detail with reference to the accompanying drawings. Like reference numerals may refer to like elements throughout this application.

FIG. 1 is a view illustrating a storage system according to an exemplary embodiment of the present inventive concept.

FIGS. 2 to 5B are views illustrating a memory device included in a storage device according to exemplary embodiments of the present inventive concept.

Referring to FIG. 1, a storage system 1 may include a storage device 10 and a host 20.

The storage device 10 may operate in response to a request of the host 20, and may store data accessed by the host 20.

The storage device 10 may include a memory device 100 storing various types of data, and a controller 200 controlling an overall operation of the memory device 100.

The memory device 100 may include a first memory device 110 and a second memory device 120.

The first memory device 110 may store the data accessed by the host 20. In some examples, the first memory device 110 may include a non-volatile memory (NVM). For example, the first memory device 110 may include a NAND flash memory, a NOR flash memory, a flash memory having a hybrid structure in which two or more types of memories are mixed, or the like.

Figure 2:
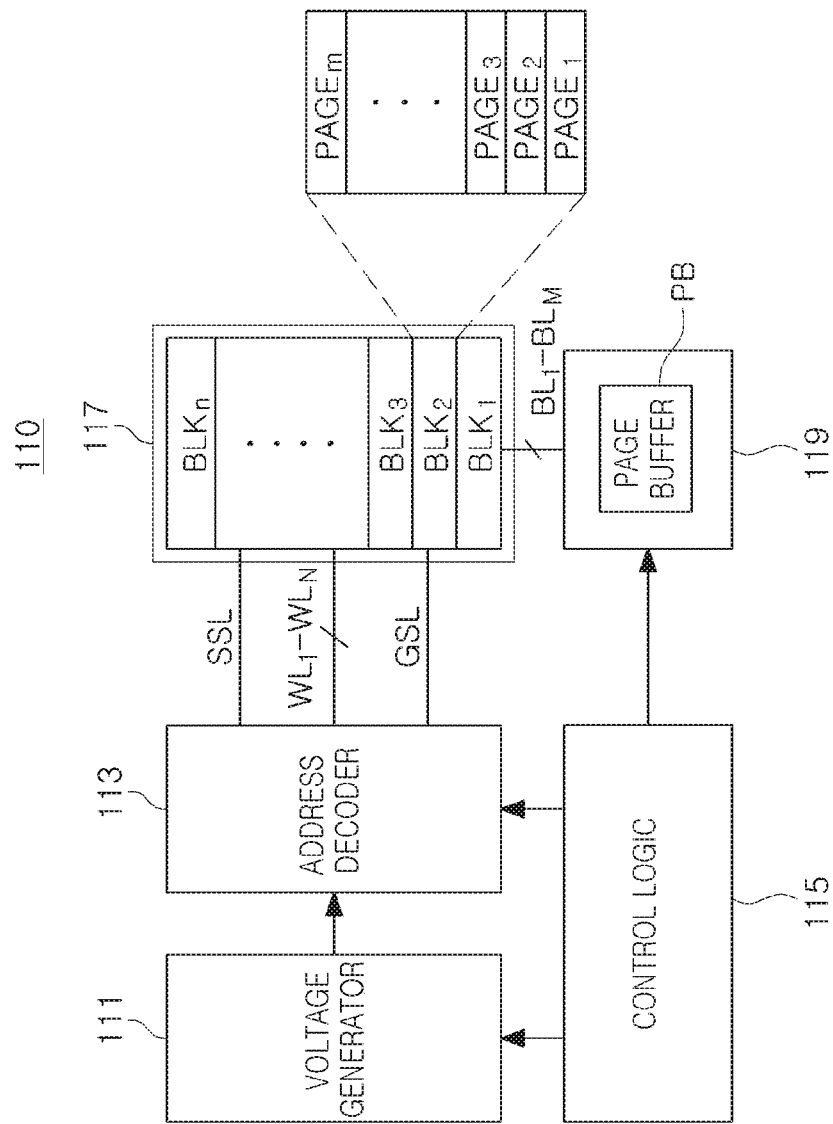
FIGS. 2 to 5B are views illustrating a memory device included in a storage device according to exemplary embodiments of the present inventive concept.

Referring to FIG. 2, the first memory device 110 may include a voltage generator 111, an address decoder 113, a control logic 115, a memory cell array 117, and a data input/output circuit 119.

The control logic 115 may receive various command and address signals from the controller 200, and may control the address decoder 113 and the data input/output circuit 119 to perform a read operation, a program operation, or the like. In addition, the control logic 115 may receive a voltage control signal from the controller 200, and control the voltage generator 111 to generate a read voltage, a program voltage, or the like.

The voltage generator 111 may generate a plurality of voltages for driving the first memory device 110. For example, the voltage generator 111 may generate a plurality of read voltages, a plurality of program voltages, a plurality of pass voltages, or the like.

The address decoder 113 may be connected to the memory cell array 117 through a string select line SSL, a plurality of word lines $WL_1$ to $WL_N$, and a ground select line GSL. The address decoder 113 may decode an address signal received from the controller 200, and may apply a read voltage to at least one word line of the word lines $WL_1$ to $WL_N$ selected according to the decoded address signal.

The data input/output circuit 119 may receive data from the plurality of memory cells connected to the word lines $WL_1$ to $WL_N$ to which the read voltage is applied, through a plurality of bit lines $BL_1$ to $BL_M$. The data input/output circuit 119 may include a page buffer PB for temporarily storing data read from the memory cell array 117 and data to be programmed in the memory cell array 117. In some examples, the page buffer PB may be implemented with a plurality of data latches.

The memory cell array 117 may include a plurality of memory blocks $BLK_1$ to $BLK_n$. In addition, each of the memory blocks $BLK_1$ to $BLK_n$ may include a plurality of pages $PAGE_1$ to $PAGE_m$. Each of the pages $PAGE_1$ to $PAGE_m$ may include a plurality of memory cells, and the plurality of memory cells may be connected to the plurality of word lines $WL_1$ to $WL_N$. The memory cells may include a single level cell (SLC) storing one bit of data, and a multi-level cell (MLC) storing two or more bits of data, according to the number of bits of data capable of being stored.

Figure 3:
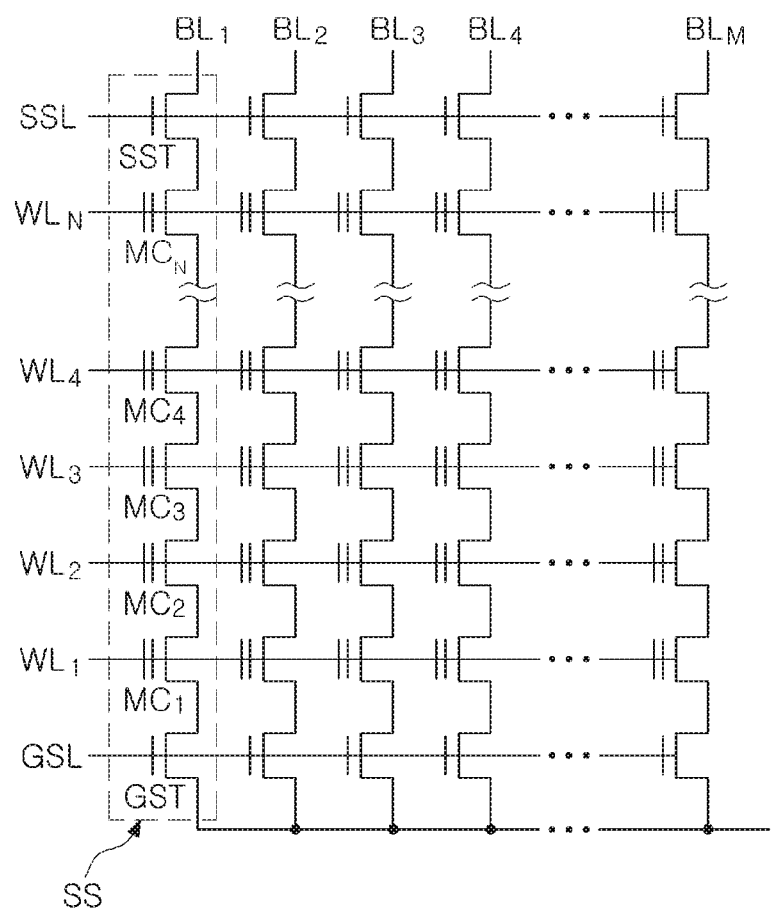

FIG. 3 is a view illustrating the plurality of memory blocks $BLK_1$ to $BLK_n$ included in the first memory device 110. Referring to FIG. 3, each of the plurality of memory blocks $BLK_1$ to $BLK_n$ may include a plurality of cell strings SS connected to the plurality of bit lines $BL_1$ to $BL_M$. Each of the cell strings SS may include select transistors SST and GST respectively connected to the string select line SSL and the ground select line GSL, and a plurality of memory cell transistors $MC_1$ to $MC_N$ connected to different word lines $WL_1$ to $WL_N$. A plurality of memory cell transistors connected to the same word line of the word lines $WL_1$ to $WL_N$ may constitute one page.

Figure 4:
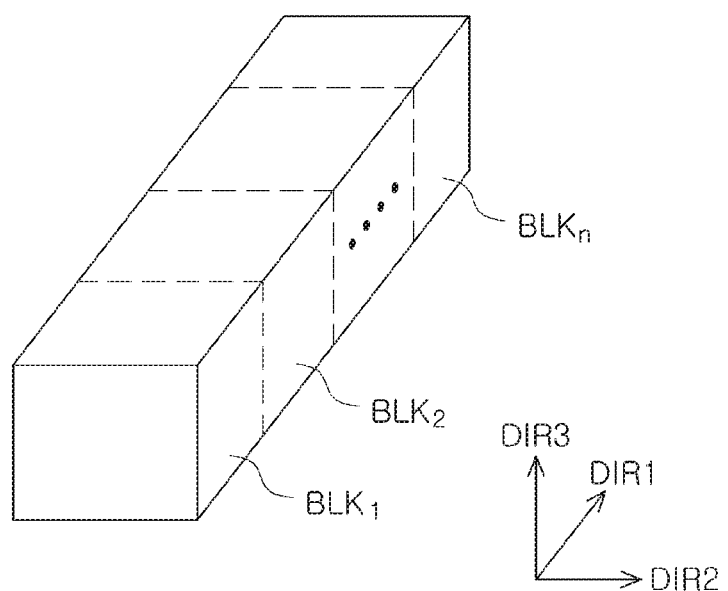

The plurality of memory blocks $BLK_1$ to $BLK_n$ may have a two-dimensional array structure in which the memory cell transistors $MC_1$ to $MC_N$ are arranged in a direction parallel to a substrate. In addition, the plurality of memory blocks $BLK_1$ to $BLK_n$ may have a three-dimensional array structure in which the plurality of memory cell transistors $MC_1$ to $MC_N$ are stacked in a direction perpendicular to the substrate, to extend in first to third directions DIR1 to DIR3, as illustrated in FIG. 4.

The second memory device 120 may store degradation information of the first memory device 110. In an exemplary embodiment of the present inventive concept, the second memory device 120 may store information regarding the number of error bits detected by the first memory device 110. In addition, the second memory device 120 may further store information about temperature of the first memory device 110, information about P/E cycles of the first memory device 110, information about intervals between an erase state and a program state of the first memory device 110, or the like.

The degradation information stored in the second memory device 120 may be used to adjust the read voltage for the first memory device 110. For example, the first memory device 110 may estimate the number of error bits that may be generated when performing a read operation using at least one of the number of error bits stored in the second memory device 120. The first memory device 110 may calculate a read voltage having an optimal read level from the estimated number of error bits, and may then perform a read operation using the calculated read voltage.

In an exemplary embodiment of the present inventive concept, the second memory device 120 may include a volatile memory device such as a dynamic RAM (DRAM), a static RAM (SRAM), or the like, and a next-generation non-volatile memory device such as a Z-NAND flash memory or the like.

In an exemplary embodiment of the present inventive concept, the second memory device 120 may be a memory device having program and read operation units less than those of the first memory device 110, and may include a resistive memory device such as a phase change RAM (PRAM), a magnetic RAM (MRAM), a resistive RAM (RRAM), or the like. The resistive memory device may have a data processing unit smaller than a data processing unit of the first memory device 110. In a different manner to a NAND flash memory performing program and read operations in units of pages, the resistive memory device may perform program and read operations in units of bytes, and thus may be suitable to store degradation information of relatively small size that may be periodically detected. In addition, since the resistive memory device has a relatively high access speed, the read operation may be prevented from being delayed. An example of the second memory device 120 may be as illustrated in FIGS. 5A and 5B.

Figure 5A:
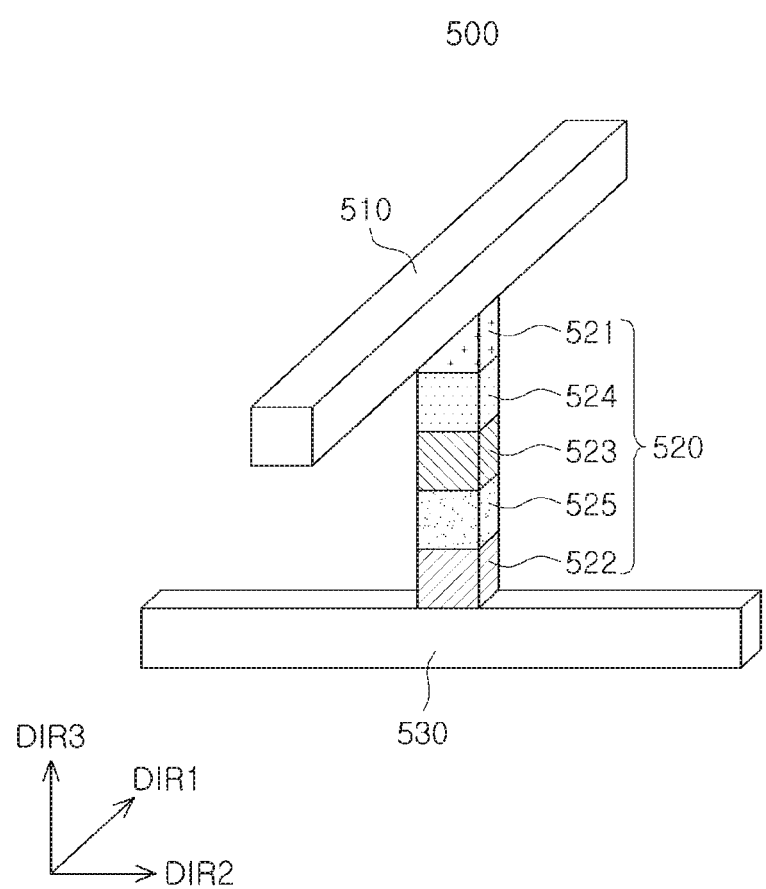
Figure 5B:
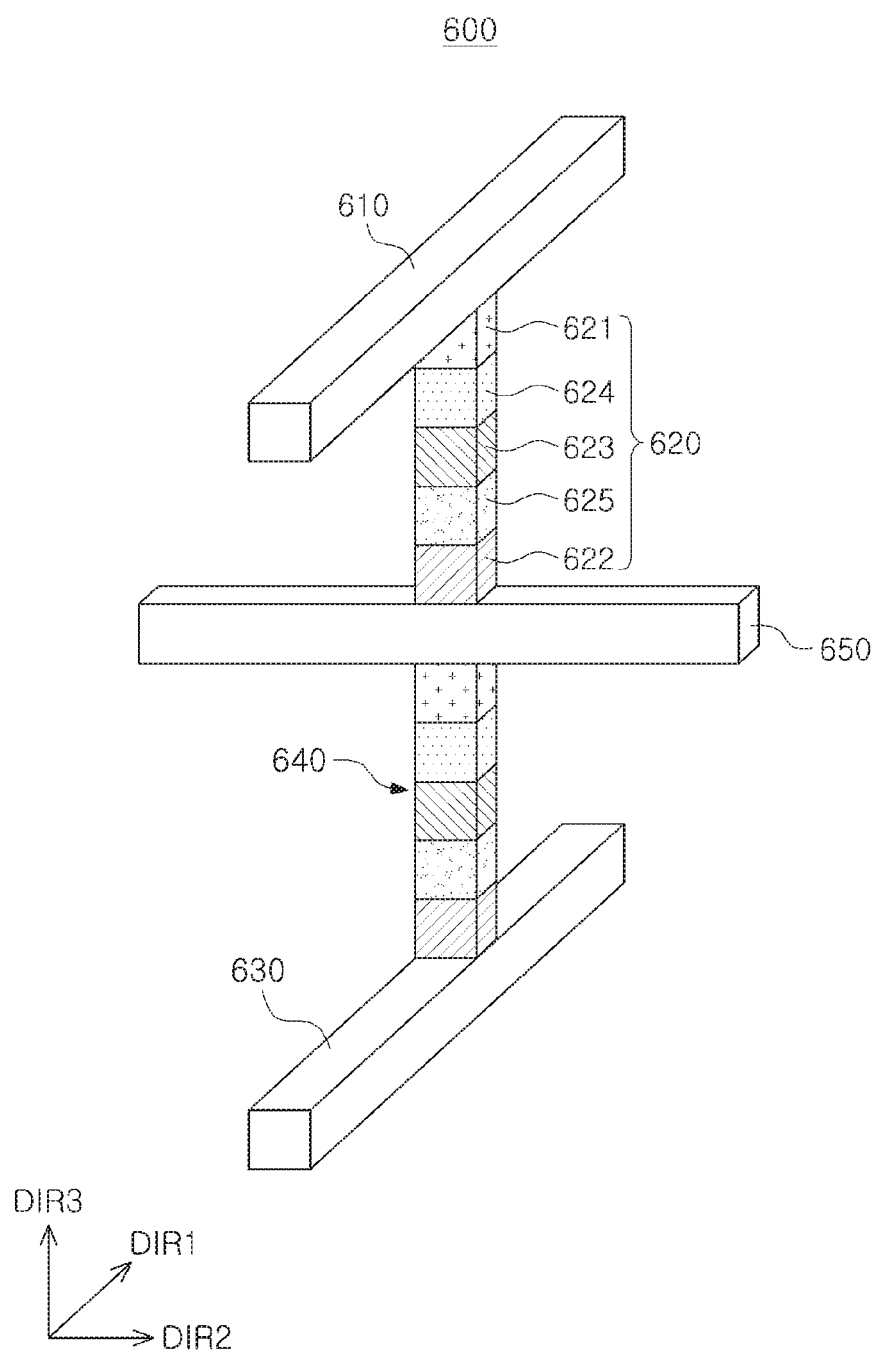

Referring to FIG. 5A, a second memory device 500, which may correspond to the second memory device 120, may include a word line 510 extending in the first direction DIR1, a bit line 530 extending in the second direction DIR2 perpendicular to the first direction DIR1, and a memory cell 520 disposed between the word line 510 and the bit line 530.

The memory cell 520 may include a first electrode 521 connected to the word line 510, a second electrode 522 connected to the bit line 530, and a third electrode 523 disposed between the first electrode 521 and the second electrode 522. In addition, the memory cell 520 may include a storage element layer 524 disposed between the first electrode 521 and the third electrode 523, and a selective element layer 525 disposed between the third electrode 523 and the second electrode 522.

The storage element layer 524 may include a germanium-antimony-tellurium (GST) material in which germanium (Ge), antimony (Sb), and tellurium (Te) are bonded. The storage element layer 524 may store data, depending on a difference in threshold voltage or resistance. For example, the storage element layer 524 may have a relatively low resistance and a relatively low threshold voltage in a crystalline state, may have a relatively high resistance and a relatively high threshold voltage in an amorphous state, and may store data using such characteristics.

The selective element layer 525 may be an element for selecting a memory cell, and may include a chalcogenide-based material in which germanium (Ge), selenium (Se), and tellurium (Te) are bonded. The selective element layer 525 may include an ovonic threshold switch (OTS) material.

Referring to FIG. 5B, a second memory device 600, which may correspond to the second memory device 120, may include a first word line 610 and a second word line 630 extending in the first direction DIR1 and spaced apart from each other in the third direction DIR3 perpendicular to the first direction DIR1, and a bit line 650 disposed between the first word line 610 and the second word line 630 and extending in the second direction DIR2, which is perpendicular to the first direction DIR1 and the third direction DIR3. In addition, the second memory device 600 may include a first memory cell 620 disposed between the first word line 610 and the bit line 650, and a second memory cell 640 disposed between the bit line 650 and the second word line 630.

The first memory cell 620 and the second memory cell 640 may have substantially the same structure as the memory cell 520 described above with reference to FIG. 5A. For example, the first memory cell 620 may include first to third electrodes 621 to 623, a storage element layer 624 disposed between the first electrode 621 and the third electrode 623, and a selective element layer 625 disposed between the third electrode 623 and the second electrode 622.

Referring again to FIG. 1, the controller 200 may be connected to the host 20 by a host interface 210, to receive a read request, a program request, or the like and exchange data. For example, the controller 200 may receive the read request from the host 20 by the host interface 210, and may control a read operation of the memory device 100 accordingly. The host interface 210 may be configured to communicate with the host 20 using at least one of various interface protocols such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), an integrated drive electronics (IDE), or the like.

The controller 200 may be connected to the memory device 100 by a memory interface 220, to process various requests of the host 20 and exchange data. For example, the controller 200 may control the memory device 100 to read or program data in response to a request of the host 20.

The controller 200 may further include a processor 230, a power management unit 240, an error correction code (ECC) unit 250, and a memory 260.

The processor 230 may control the overall operation of the memory device 100, and may include a microprocessor, a central processing unit (CPU), or the like. The processor 230 may drive firmware such as a flash translation layer (FTL) to control the memory device 100.

The processor 230 may control a read operation on a plurality of memory blocks included in the memory device 100, to prevent degradation of performance, occurrence of read failure, or the like due to retention characteristics of the memory device 100 or the like. Hereinafter, the read operation will be referred to as a patrol read operation to distinguish it from a read operation according to a request of the host 20.

The processor 230 may perform the patrol read operation by issuing a read command and address by itself, without receiving the read request from the host 20. The patrol read operation may be performed in a background, in a different manner from the read operation performed in a foreground according to the read request of the host 20. In addition, the patrol read operation may be periodically performed under control of the processor 230. A period of the patrol read operation may be preset based on an increase rate of error bits, a storage capacity of the memory device 130, a program/erase (P/E) cycle, or the like. In some examples, the period of the patrol read operation may be about 12 hours.

The number of error bits included in data read from the first memory device 110 as a result of the patrol read operation may represent degradation information of the first memory device 110, and may be stored in the second memory device 120.

The power management unit 240 may supply and manage power to components of the controller 200, respectively.

The ECC unit 250 may detect and correct an error included in data read from the memory device 100. For example, the ECC unit 250 may perform an ECC encoding operation on data received from the host 20. The ECC unit 250 may perform an ECC decoding operation on the data read from the memory device 100, and may correct corresponding error bits, when the number of error bits detected as a result of performing the ECC decoding operation is less than a predetermined threshold value. The ECC unit 250 may perform the error correction operation using a low-density parity check (LDPC) code, a Bose-Chaudhuri-Hocquenghem (BCH) code, a turbo code, or the like.

The memory 260 may be an operation memory, and may store data for driving the controller 200, such as a firmware code or the like. In addition, the memory 260 may be a buffer memory, and may store data read from the memory device 100 or data to be programmed in the memory device 100. In some examples, the memory 260 may include a volatile memory, such as DRAM, SRAM, or the like.

Figure 6:
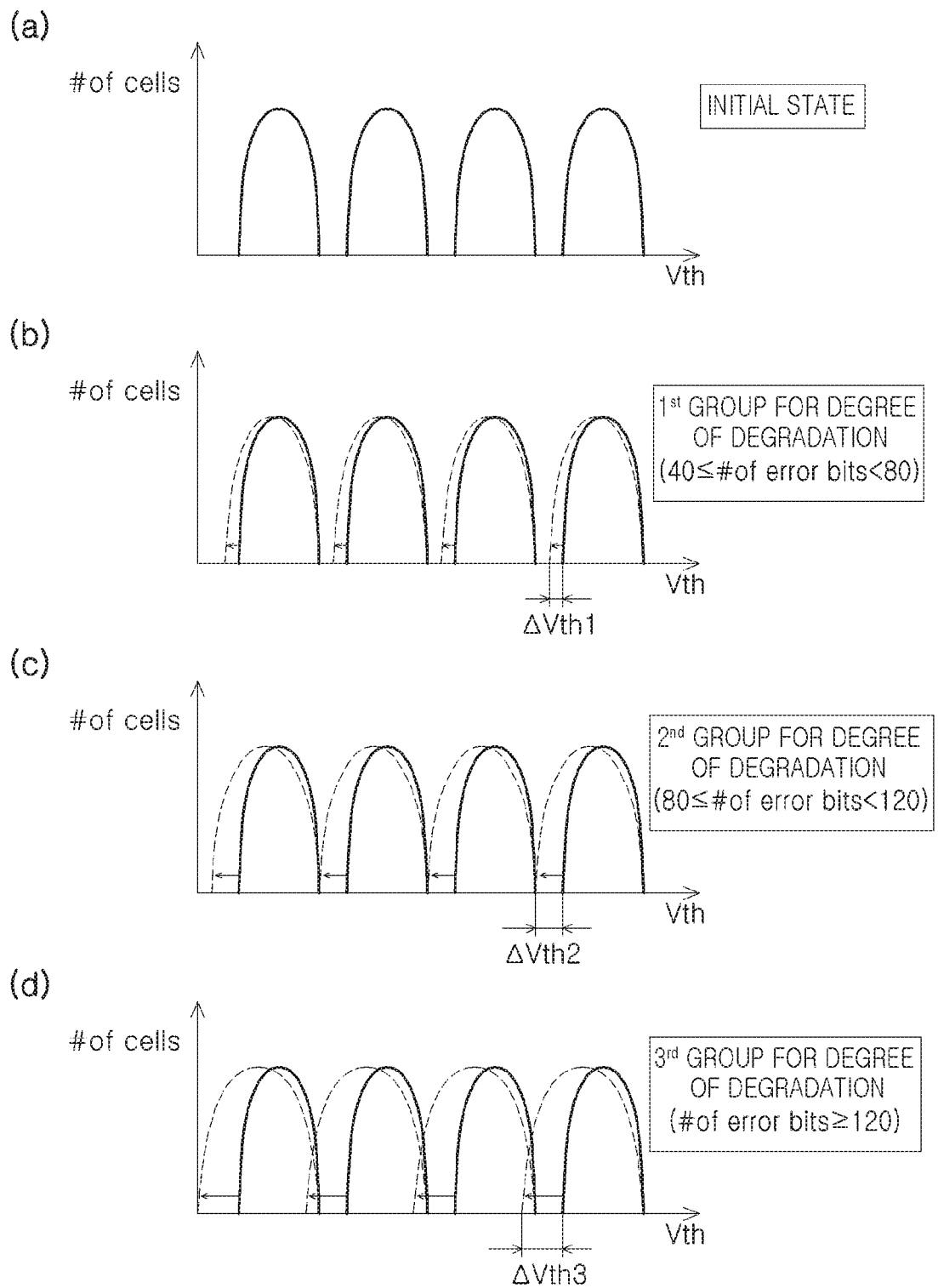
FIG. 6 is a view illustrating a variation in threshold voltage distribution according to a degree of degradation of memory cells included in a first memory device of FIG. 1 according to an exemplary embodiment of the present inventive concept.

FIG. 6 is a view illustrating a variation in threshold voltage distribution according to a degree of degradation of memory cells included in a first memory device of FIG. 1 according to an exemplary embodiment of the inventive concept. In FIG. 6, a horizontal axis represents a threshold voltage Vth, and a vertical axis represents the number of memory cells.

Portion (a) in FIG. 6 illustrates a threshold voltage distribution (an initial state) within a predetermined time, after completion of a program operation on memory cells, and portions (b) to (d) in FIG. 6 illustrate threshold voltage distributions after the predetermined time, after completion of the program operation on memory cells.

Portion (b) in FIG. 6 illustrates a threshold voltage distribution of memory cells classified as a group having a relatively low degree of degradation, portion (c) in FIG. 6 illustrates a threshold voltage distribution of memory cells classified as a group having a relatively intermediate degree of degradation, and portion (d) in FIG. 6 illustrates a threshold voltage distribution of memory cells classified as a group having a relatively high degree of degradation.

First, referring to portion (b) in FIG. 6, when the number of error bits of the memory cells is 40 or more and less than 80, the corresponding memory cells may be classified as a first group having a relatively low degree of degradation. In the first group of memory cells, the threshold voltage distribution may vary by a first value ($\Delta Vth1$) compared to the initial state (portion (a) in FIG. 6).

Referring to portion (c) in FIG. 6, when the number of error bits of the memory cells is 80 or more and less than 120, the corresponding memory cells may be classified as a second group having a relatively intermediate degree of degradation. In the second group of memory cells, the threshold voltage distribution may vary by a second value ($\Delta Vth2$), greater than the first value ($\Delta Vth1$), compared to the initial state (portion (a) in FIG. 6).

Referring to portion (d) in FIG. 6, when the number of error bits of the memory cells is 120 or more, the corresponding memory cells may be classified as a third group having a relatively high degree of degradation. In the third group of memory cells, the threshold voltage distribution may vary by a third value ($\Delta Vth3$), greater than the second value ($\Delta Vth2$), compared to the initial state (portion (a) in FIG. 6).

Memory cells may deteriorate due to various factors such as an increase in retention time, occurrence of a read disturb error, a decrease in endurance due to increased program/erase (P/E) cycles, or the like. The degree of degradation of the memory cells may vary for each page that may be program and read operation units. When the read voltage is adjusted in units of a memory block including a plurality of pages without considering degradation of each page, pages with a relatively low degree of degradation, together with pages with a relatively high degree of degradation, may enter a defense code. In this case, since data recovered after entering the defense code may be copied to another memory block by a read reclaim operation, a problem may occur in that a write amplification factor (WAF) increases.

Accordingly, a storage device according to an exemplary embodiment of the present inventive concept may perform a patrol read operation to detect the number of error bits per page, and may classify the degree of degradation of each page using the detected number of error bits. For example, when the number of error bits detected in a first page of the memory device is 50, the storage device may classify the first page as the first group. When the number of error bits detected in a second page of the memory device is 100, the storage device may classify the second page as the second group. In addition, when the number of error bits detected in a third page of the memory device is 120, the storage device may classify the third page as the third group.

The storage device may map different read voltage values for each of the plurality of groups for degree of degradation, set for each page. For example, a first read voltage value may be mapped for the first group having a relatively low degree of degradation, and a third read voltage value, greater than the first read voltage value, may be mapped for the third group having a relatively high degree of degradation. When the read operation is performed on a specific page, the storage device may change the read voltage using a read voltage value mapped for a group to which the page belongs, and then may perform the read operation for the corresponding page using the changed read voltage.

As described above, the storage device according to an exemplary embodiment of the present inventive concept may control the read voltage value differently in consideration of the degree of degradation of each page, to solve the problem of executing at least one defensive (or defense) code to a page having a relatively low degree of degradation by a read retry (or read reclaim) operation in units of memory blocks.

Figure 7:
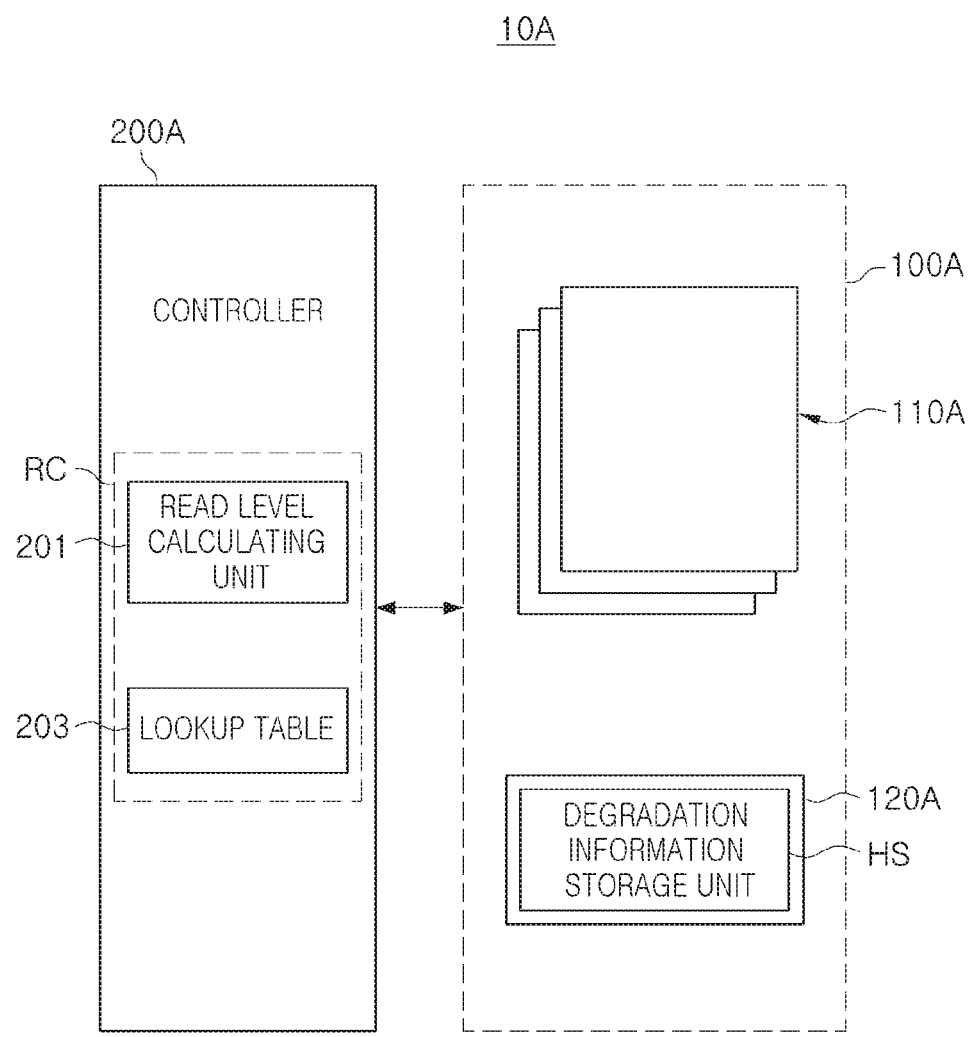
FIG. 7 is a view illustrating a storage device according to an exemplary embodiment of the present inventive concept.

FIG. 7 is a view illustrating a storage device according to an exemplary embodiment of the present inventive concept.

Figure 8:
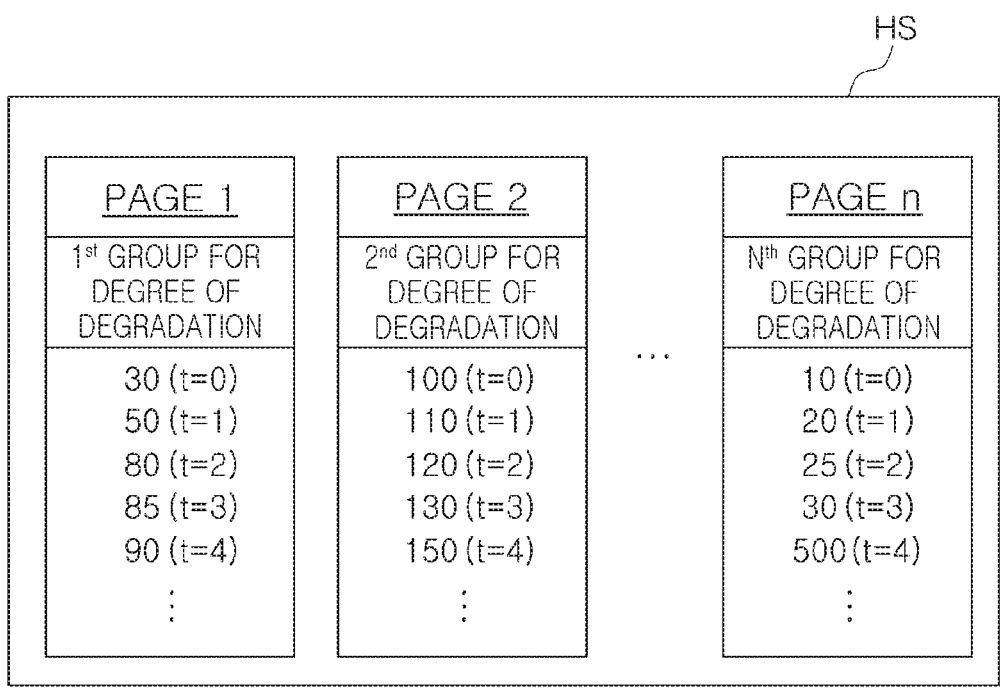
FIG. 8 is a view illustrating a degradation information storage unit of FIG. 7 according to an exemplary embodiment of the present inventive concept.

FIG. 8 is a view illustrating a degradation information storage unit of FIG. 7 according to an exemplary embodiment of the present inventive concept, and FIGS. 9A to 12 are views illustrating a method of estimating error information by a read level calculating unit of FIG. 7 according to exemplary embodiments of the present inventive concept.

First, referring to FIG. 7, a storage device 10A according to an exemplary embodiment of the present inventive concept may include a memory device 100A and a controller 200A.

The memory device 100A may include a first memory device 110A storing data requested by a host, and a second memory device 120A storing degradation information of the first memory device 110A. The first memory device 110A may include a single level cell (SLC) storing one bit of data, and a multi-level cell (MLC) storing two or more bits of data. In an exemplary embodiment of the present inventive concept, the first memory device 110A may include a quad level cell (QLC) capable of storing four or more bits of data in a single memory cell.

In an exemplary embodiment of the present inventive concept, the second memory device 120A may be a memory device having a program unit different from that of the first memory device 110A, and may include a resistive memory device such as a PRAM, an MRAM, a RRAM, or the like. In this case, since the second memory device 120A is accessible in byte units and has a relatively fast access speed, the second memory device 120A may be suitable for storing and managing degradation information of the first memory device 110A in page units.

In addition, in an exemplary embodiment of the present inventive concept, the second memory device 120A may be a memory device having a faster access speed than the first memory device 110A, and may include a next-generation memory device such as a Z-NAND flash memory. In this case, since the second memory device 120A has a relatively fast access speed, delay due to read voltage control may be minimized.

The second memory device 120A may include a degradation information storage unit HS for storing degradation information of the first memory device 110A. In an exemplary embodiment of the present inventive concept, degradation information stored in the second memory device 120A may include the number of error bits of the first memory device 110A, information about temperature of the first memory device 110A, information about P/E cycles of the first memory device 110A, information about intervals between an erase state and a program state of the first memory device 110A, or the like.

A specific example of the degradation information storage unit HS is illustrated in FIG. 8. Referring to FIG. 8, the degradation information storage unit HS may store information about groups for degree of degradation (e.g., the first to third groups) and history information about the number of error bits for each page. The number of error bits may be obtained by performing a patrol read operation using a predetermined first read voltage, until read failure occurs. In an exemplary embodiment of the present inventive concept, the first read voltage may be greater than a second read voltage used to perform a read operation according to a request of the host. When the read failure occurs according to the patrol read operation, the patrol read operation may be continuously performed using a voltage lower than the first read voltage.

Referring back to FIG. 7, the controller 200A may further include a read voltage controller RC for calculating a read voltage suitable for a current read operation using degradation information of the first memory device 110A.

The read voltage controller RC may include a read level calculating unit 201 and a lookup table 203.

The read level calculating unit 201 may receive existing degradation information of a target page for performing a read operation, from the degradation information storage unit HS, and may use the received existing degradation information to estimate degradation information of the target page. For example, the read level calculating unit 201 may receive information about a group for degree of degradation to which the target page belongs and information about the number of existing error bits generated in the target page, from the degradation information storage unit HS. The read level calculating unit 201 may use the existing degradation information to estimate the number of error bits that may occur in the target page when the read operation is performed on the target page. In such an estimation operation, the read level calculating unit 201 may use a linear polynomial operation.

Figure 9A:
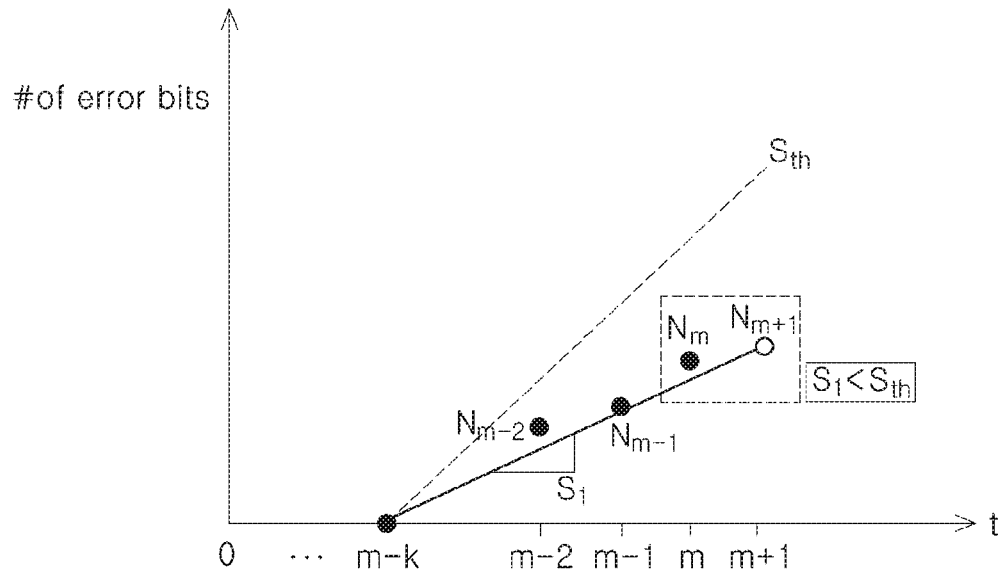
FIGS. 9A to 12 are views illustrating a method of estimating error information by a read level calculating unit of FIG. 7 according to exemplary embodiments of the present inventive concept.
Figure 9B:
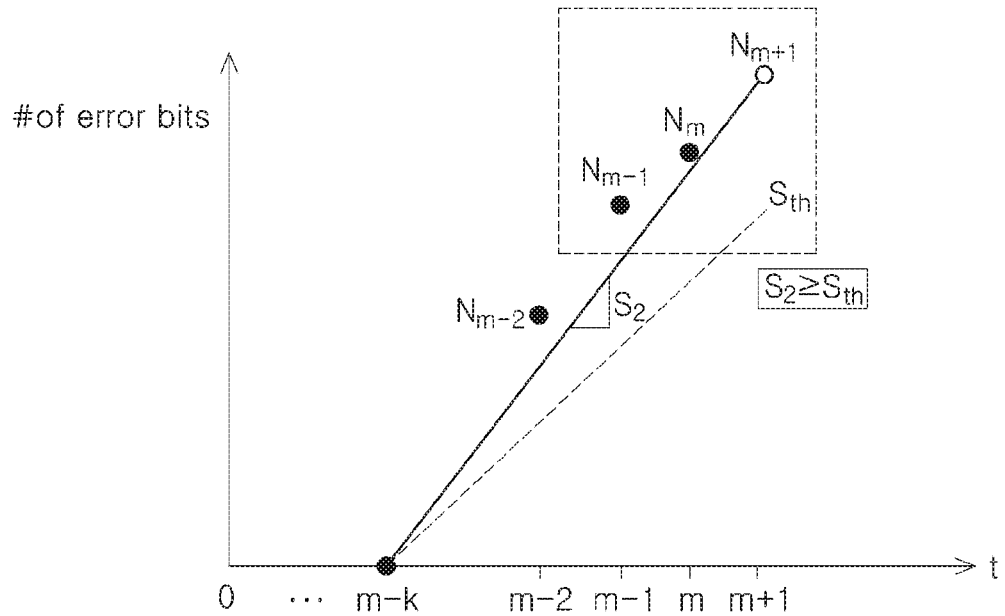
Figure 10:
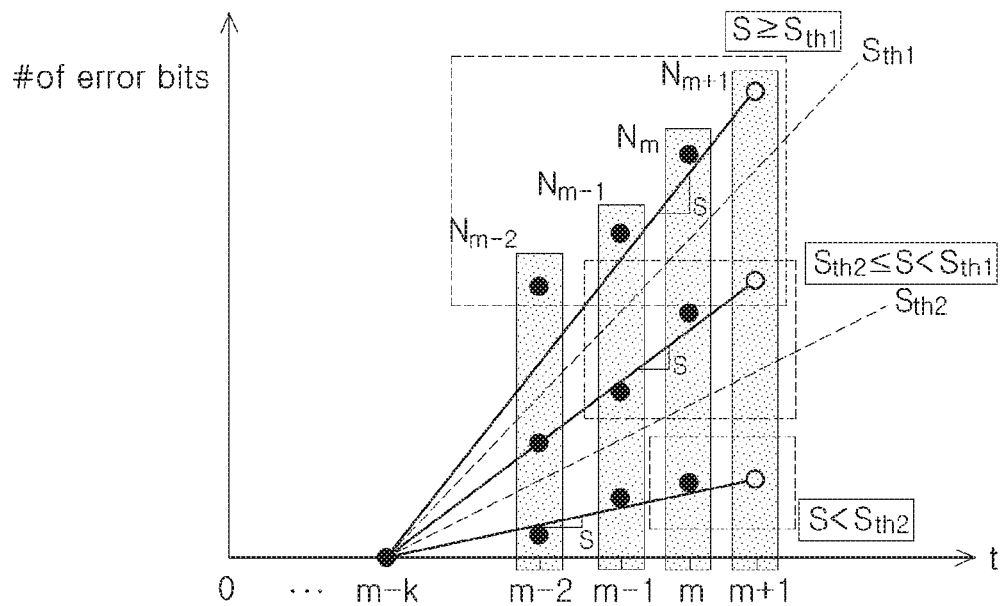

In an exemplary embodiment of the present inventive concept, the read level calculating unit 201 may change a reference number for the number of existing error bits according to a degradation rate of the target page. For example, referring to FIG. 9A, when a rate of change $(S_1)$ of the number of error bits is less than a predetermined threshold rate of change $(S_{th})$, the degradation rate of the target page may be regarded as relatively slow. In this case, the read level calculating unit 201 may estimate the number of error bits $(N_{m+1})$ after performing the read operation with reference to the number of most recent error bits $(N_m)$ to increase a calculation speed. Referring to FIG. 9B, when a rate of change $(S_2)$ of the number of error bits is greater than or equal to the predetermined threshold rate of change $(S_{th})$, the degradation rate of the target page may be regarded as relatively high. In this case, the read level calculating unit 201 may estimate the number of error bits $(N_{m+1})$ after performing the read operation with reference to the numbers of two or more recent error bits $(N_m$ and $N_{m-1})$ to increase estimation accuracy.

The degradation rate of the target page may be divided into a plurality of steps, and a reference number for the number of the existing error bits may vary for each step. For example, referring to FIG. 10, when a rate of change (S) in the number of error bits is greater than or equal to a first threshold rate of change $(S_{th1})$, a degradation rate of the target page may be classified as a first step. In this case, the read level calculating unit 201 may estimate the number of error bits $(N_{m+1})$ after performing the read operation, with reference to the numbers of three recent error bits $(N_m, N_{m-1},$ and $N_{m-2})$. When the rate of change (S) in the number of error bits is greater than or equal to a second threshold rate of change $(S_{th2})$ and less than the first threshold rate of change $(S_{th})$, a degradation rate of the target page may be classified as a second step. In this case, the read level calculating unit 201 may estimate the number of error bits $(N_{m+1})$ after performing the read operation with reference to the numbers of two recent error bits $(N_m$ and $N_{m-1})$. When the rate of change (S) in the number of error bits is less than the second threshold rate of change $(S_{th2})$, a degradation rate of the target page may be classified as a third step. In this case, the read level calculating unit 201 may estimate the number of error bits $(N_{m+1})$ after performing the read operation with reference to the number of most recent error bits $(N_m)$.

In an exemplary embodiment of the present inventive concept, the read level calculating unit 201 may change the reference number for the number of existing error bits, according to possibility of occurrence of an uncorrectable ECC (UECC) of the target page.

Figure 11A:
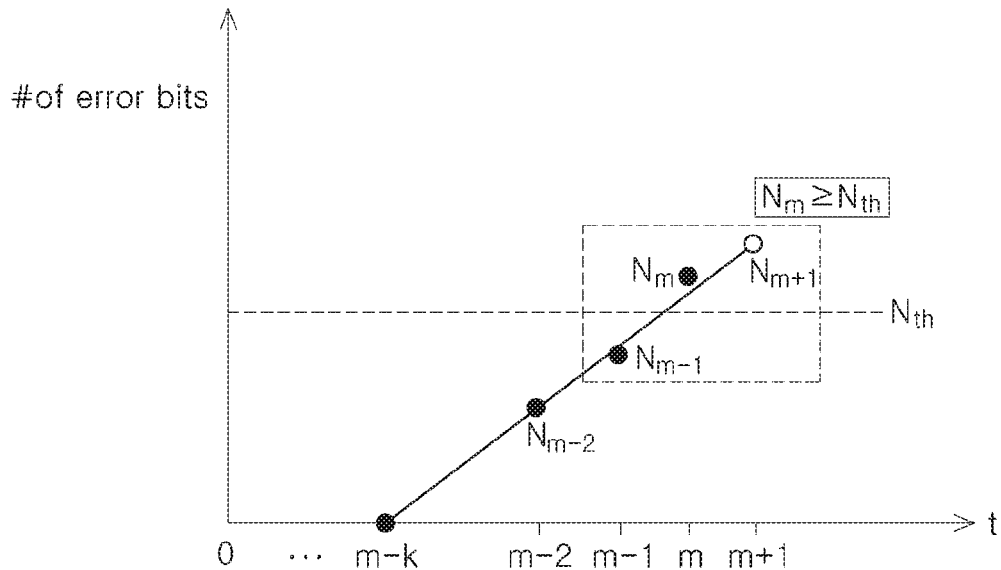

For example, referring to FIG. 11A, when the number of most recent error bits $(N_m)$ is greater than or equal to a predetermined threshold value $(N_{th})$, the possibility of occurrence of the UECC of the target page is relatively high. In this case, to more accurately adjust a read voltage, the read level calculating unit 201 may use the numbers of two or more recent error bits $(N_m$ and $N_{m-1})$ to estimate the number of error bits $(N_{m+1})$ after performing the read operation.

Figure 11B:
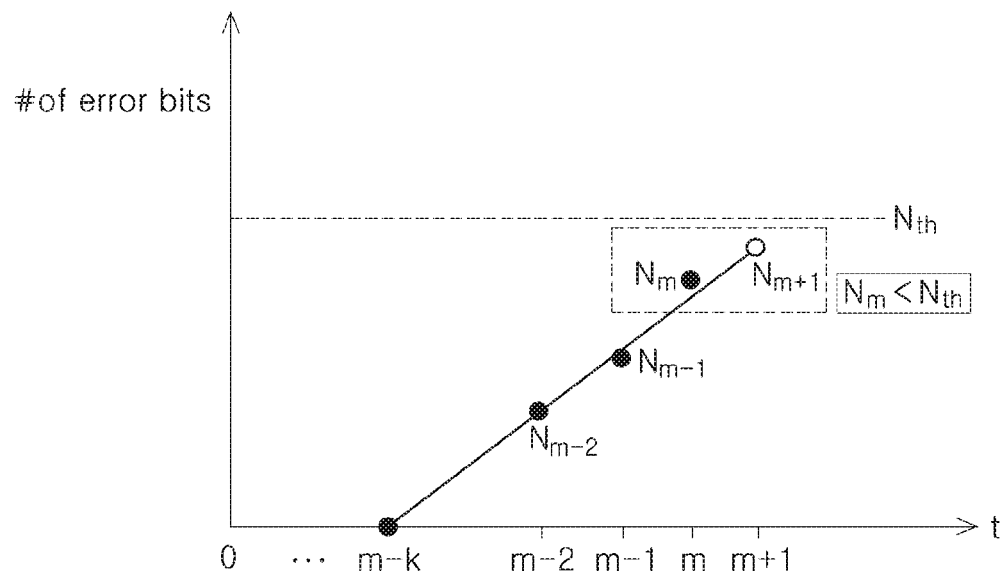
Figure 12:
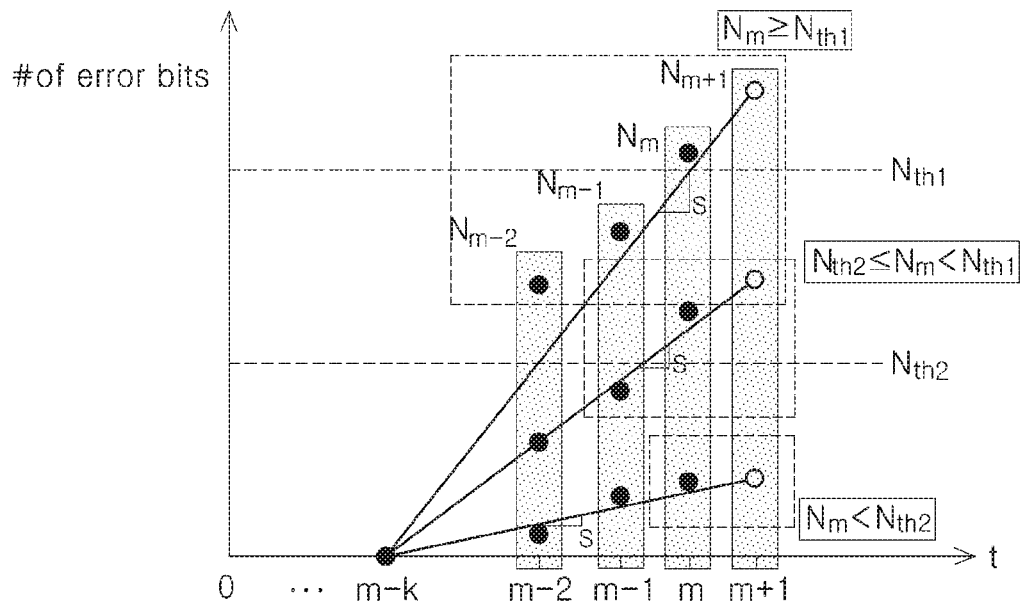

Referring to FIG. 11B, when the number of most recent error bits $(N_m)$ is less than a predetermined threshold value $(N_{th})$, the possibility of occurrence of the UECC of the target page is relatively low. In this case, to adjust the read voltage more quickly, the read level calculating unit 201 may use the number of most recent error bits $(N_m)$ to estimate the number of error bits $(N_{m+1})$ after performing the read operation.

The possibility of occurrence of the UECC of the target page may be divided into a plurality of steps, and a reference number for the number of the existing error bits may vary for each step. For example, referring to FIG. 12, when the number of most recent error bits $(N_m)$ is greater than or equal to a first threshold value $(N_{th1})$, the possibility of occurrence of the UECC of the target page may be classified as a first step. In this case, the read level calculating unit 201 may estimate the number of error bits $(N_{m+1})$ after performing the read operation, with reference to the numbers of three recent error bits $(N_m, N_{m+1},$ and $N_{m-2})$. When the number of most recent error bits $(N_m)$ is greater than or equal to a second threshold value $(N_{th2})$ and less than the first threshold value $(N_{th1})$, the possibility of occurrence of the UECC of the target page may be classified as a second step. In this case, the read level calculating unit 201 may estimate the number of error bits $(N_{m+1})$ after performing the read operation with reference to the numbers of two recent error bits $(N_m$ and $N_{m-1})$. In addition, when the number of most recent error bits $(N_m)$ is less than the second threshold value $(N_{th2})$, the possibility of occurrence of the UECC of the target page may be classified as a third step. In this case, the read level calculating unit 201 may estimate the number of error bits $(N_{m+1})$ after performing the read operation with reference to the number of most recent error bits $(N_m)$.

The read level calculating unit 201 may use the lookup table 203 to calculate a read voltage for the target page from the number of error bits. For example, the read level calculating unit 201 may use mapping information between error bit information and a read voltage correction value, stored in the lookup table 203, to calculate a read voltage for the target page. An example of the lookup table 203 may be the same as illustrated in FIGS. 13A to 13C.

Figure 14A:
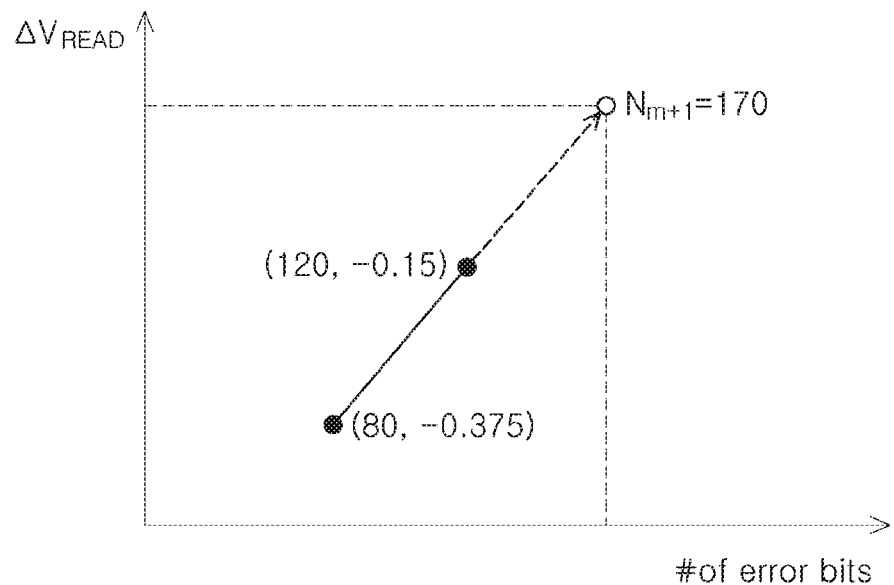
FIGS. 14A and 14B are graphs illustrating a linear polynomial operation to estimate a number of error bits according to exemplary embodiments of the present inventive concept.
Figure 14B:
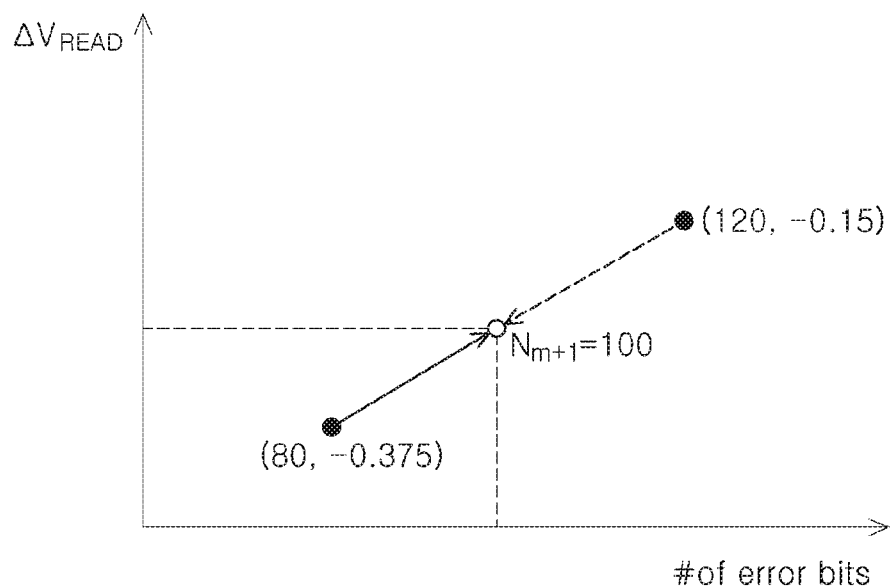

FIGS. 13A to 13C are views illustrating a lookup table according to exemplary embodiments of the present inventive concept. FIGS. 14A and 14B are graphs illustrating a linear polynomial operation to estimate a number of error bits according to exemplary embodiments of the present inventive concept.

Referring to FIG. 13A, a lookup table 203A according to an exemplary embodiment of the present inventive concept may store mapping information between the number of error bits ($N_{m+1}$), occurred in performing a read operation on a target page, and a read voltage correction value ($\Delta V_{READ}$), for each group for degree of degradation. In this case, the read level calculating unit 201 may obtain the read voltage correction value ($\Delta V_{READ}$) from the number of error bits ($N_{m+1}$) estimated in the target page, with reference to the lookup table 203A.

For example, when the target page belongs to a first group for degree of degradation and the number of error bits ($N_{m+1}$) estimated in the target page is 10, the read level calculating unit 201 may adjust a read voltage ($V_{READ}$) for the target page by −0.125V, with reference to the lookup table 203A. In addition, when the target page belongs to a second group for degree of degradation and the number of error bits ($N_{m+1}$) estimated in the target page is 40, the read level calculating unit 201 may adjust a read voltage ($V_{READ}$) for the target page by −0.25V, with reference to the lookup table 203A.

The groups for degree of degradation may be preset based on the number of error bits, as described above with reference to FIG. 6. For example, pages having greater than or equal to 40 error bits and less than 80 error bits may be classified as the first group having a relatively low degree of degradation. Pages having greater than or equal to 80 error bits and less than 120 error bits may be classified as the second group having a relatively intermediate degree of degradation. In addition, pages having greater than or equal to 120 error bits may be classified as the third group having a relatively high degree of degradation. Since the above is only illustrative, the classification criteria of the groups for degree of degradation may be variously set based on storage capacity of a memory device, a system policy, or the like.

In an exemplary embodiment of the present inventive concept, when mapping information for the target page cannot be obtained from the lookup table 203A, the read level calculating unit 201 may use at least one piece of degradation information that may be obtained from the lookup table 203A and the read voltage correction value ($\Delta V_{READ}$) mapped thereto, to calculate the read voltage ($V_{READ}$). For example, when the read level calculating unit 201 does not find the number of error bits ($N_{m+1}$) estimated in the lookup table 203A, two mapping information, closest to the number of error bits ($N_{m+1}$) estimated in the mapping information of the lookup table 203A, may be used to calculate the read voltage ($V_{READ}$).

In the example of FIG. 13A, when the target page belongs to the first group for degree of degradation and the number of error bits ($N_{m+1}$) estimated in the target page is 170, the read level calculating unit 201 may perform a linear polynomial operation using the read voltage correction value ($\Delta V_{READ}$) in a case of 80 error bits ($N_{m+1}$) and the read voltage correction value ($\Delta V_{READ}$) in a case of 120 error bits ($N_{m+1}$), to calculate the read voltage correction value ($\Delta V_{READ}$) in a case of 170 error bits ($N_{m+1}$). This example is illustrated in FIG. 14A.

In the example of FIG. 13A, when the target page belongs to the first group for degree of degradation and the number of error bits ($N_{m+1}$) estimated in the target page is 100, the read level calculating unit 201 may perform a linear polynomial operation using a the read voltage correction value ($\Delta V_{READ}$) in a case of 80 error bits ($N_{m+1}$) and the read voltage correction value ($\Delta V_{READ}$) in a case of 120 error bits ($N_{m+1}$), to calculate the read voltage correction value ($\Delta V_{READ}$) in a case of 100 error bits ($N_{m+1}$). This example is illustrated in FIG. 14B.

Next, referring to FIG. 13B, a lookup table 203B according to an exemplary embodiment of the present inventive concept may store mapping information between an increase in the number of error bits ($\Delta N = N_{m+1} - N_m$), which occurs in performing a read operation on a target page, and the read voltage correction value ($\Delta V_{READ}$), for each group for degree of degradation. In this case, the read level calculating unit 201 may obtain the read voltage correction value ($\Delta V_{READ}$) from the increase in the number of error bits ($\Delta N$) in the target page, with reference to the lookup table 203B. For example, when the target page belongs to the first group for degree of degradation and the increase in the number of error bits ($\Delta N$) estimated in the target page is 30, the read level calculating unit 201 may adjust the read voltage ($V_{READ}$) for the target page by −0.05V, with reference to the lookup table 203B. In addition, when the target page belongs to the second group for degree of degradation and the increase in the number of error bits ($\Delta N$) estimated in the target page is 20, the read level calculating unit 201 may adjust the read voltage ($V_{READ}$) for the target page by −0.03V, with reference to the lookup table 203B.

When mapping information for the target page cannot be obtained from the lookup table 203B, as described above with reference to FIGS. 13A, 14A, and 14B, the read level calculating unit 201 may use at least one piece of degradation information that may be obtained from the lookup table 203B and the read voltage correction value ($\Delta V_{READ}$) mapped thereto, to calculate the read voltage ($V_{READ}$). For example, the read level calculating unit 201 may perform a linear polynomial operation using two mapping information, closest to the increase in the number of error bits ($\Delta N$) estimated in the mapping information of the lookup table 203B, to calculate the read voltage ($V_{READ}$).

Referring to FIG. 13C, a lookup table 203C according to an exemplary embodiment of the present inventive concept may store mapping information between group information regarding the number of error bits ($N_{m+1}$), which occur in performing a read operation on a target page, and the read voltage correction value ($\Delta V_{READ}$), for each group for degree of degradation. In a different manner from the lookup table 203A of FIG. 13A, the lookup table 203C of FIG. 13C may group the number of error bits ($N_{m+1}$) into a predetermined range, and may store mapping information in which the read voltage correction value ($\Delta V_{READ}$) is mapped to a plurality of groups accordingly.

In this case, the read level calculating unit 201 may obtain the read voltage correction value ($\Delta V_{READ}$) from the number of error bits ($N_{m+1}$) estimated in the target page, with reference to the lookup table 203C. For example, when the target page belongs to the first group for degree of degradation and the number of error bits ($N_{m+1}$) estimated in the target page is 40, the number of error bits ($N_{m+1}$) in the target page may belong to A1 group. In this case, the read level calculating unit 201 may adjust the read voltage ($V_{READ}$) for the target page by −0.4V. In addition, when the target page belongs to the second group for degree of degradation and the number of error bits ($N_{m+1}$) estimated in the target page is 60, the number of error bits ($N_{m+1}$) in the target page may belong to B2 group. In this case, the read level calculating unit 201 may adjust the read voltage ($V_{READ}$) for the target page by −0.5V.

The storage device 10A according to an exemplary embodiment of the present inventive concept may store degradation information of the memory cells, included in the first memory device 110A, in the second memory device 120A, accessible in bytes and having a relatively fast access speed, and calculate the read voltage for the first memory device 110A using the degradation information, to prevent an increase in the write amplification factor (WAF) due to frequent read reclaim operations. In addition, the storage device 10A may calculate an optimum read voltage using the degradation information for each page stored in the second memory device 120A, to prevent a read failure. Hereinafter, a method of operating the storage device 10A according to an exemplary embodiment of the present inventive concept will be described with reference to FIGS. 15A and 15B.

Figure 15A:
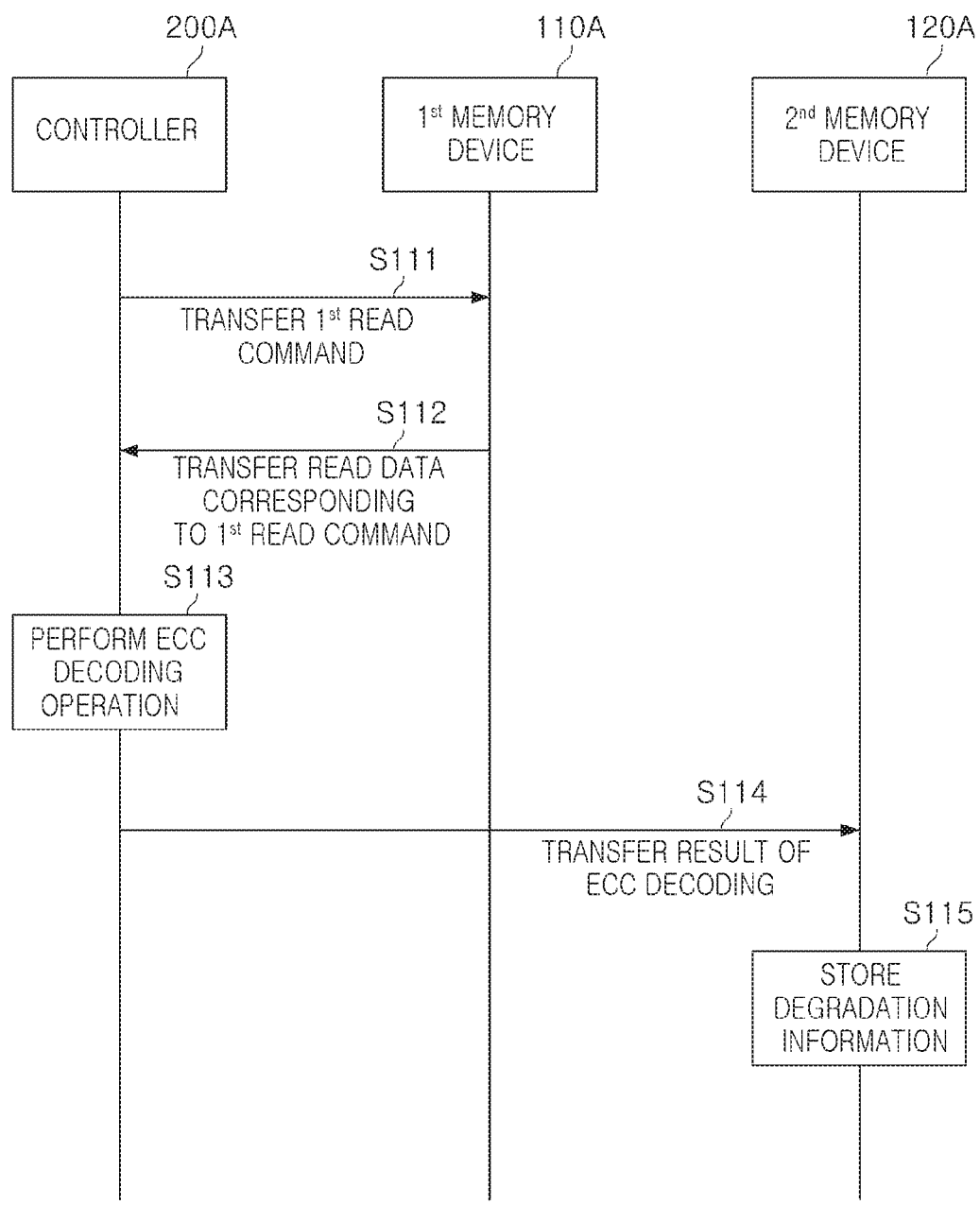
FIGS. 15A and 15B are views illustrating an operating method of the storage device of FIG. 7 according to an exemplary embodiment of the present inventive concept.
Figure 15B:
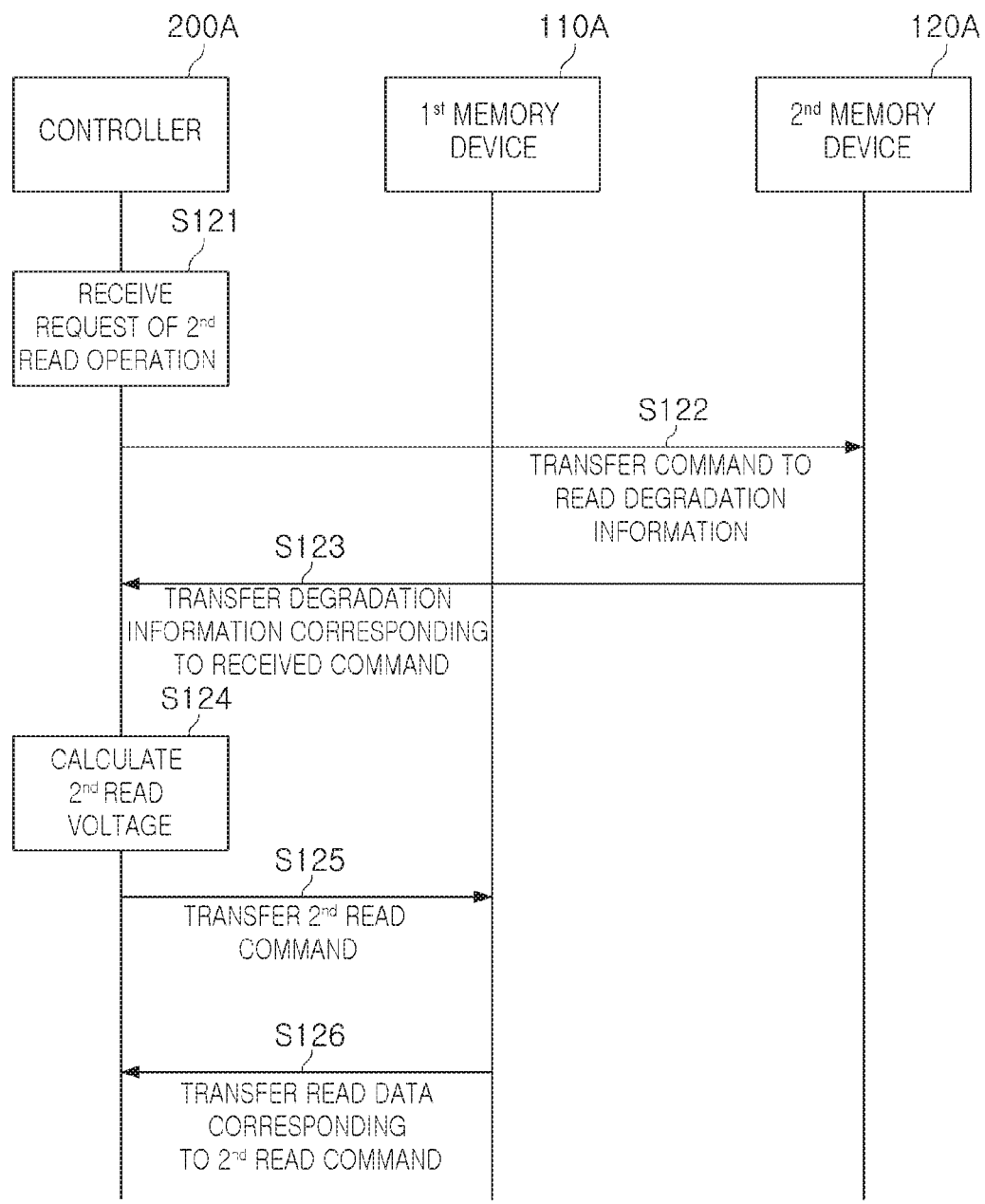

FIGS. 15A and 15B are views illustrating an operating method of the storage device of FIG. 7 according to an exemplary embodiment of the present inventive concept.

First, referring to FIG. 15A, the controller 200A may transfer a first read command and address signals for a first read operation to the first memory device 110A (S111). In an exemplary embodiment of the present inventive concept, the first read operation may be a patrol read operation executed in the background to acquire information about error bits of the first memory device 110A.

The first memory device 110A may perform the first read operation in response to the first read command for the first read operation, and then may transfer read data to the controller 200A corresponding to the first read command (S112).

The controller 200A may perform an ECC decoding operation on the read data, and may detect the number of error bits included in the read data (S113). Thereafter, the controller 200A may transfer the number of error bits detected in the read data, as results of the ECC decoding operation, to the second memory device 120A (S114). The second memory device 120A may set a group for degree of degradation for the page, based on the number of error bits in the read data, and may store the number of error bits, together with information about the group for degree of degradation, as degradation information of the first memory device 110A (S115). In an exemplary embodiment of the present inventive concept, degradation information stored in the second memory device 120A may further include information about temperature of the first memory device 110A, information about P/E cycles of the first memory device 110A, information about intervals between an erase state and a program state of the first memory device 110A, or the like, in addition to the number of error bits of the first memory device 110A.

Next, referring to FIG. 15B, the controller 200A may receive a request of a second read operation from the host (S121). The second read operation may be a read operation on data stored in the first memory device 110A.

The controller 200A may transfer a command for the second read operation on degradation information to the second memory device 120A, to set a read voltage for the second read operation (S122). In response thereto, the second memory device 120A may transfer the number of existing error bits and information about a group for degree of degradation, in a target page to perform the second read operation, to the controller 200A (S123).

The controller 200A may use the degradation information to calculate a second read voltage suitable for performing the second read operation on the target page (S124). For example, the controller 200A may use the degradation information, to estimate the number of error bits that may occur when the second read operation is performed on the target page. The controller 200A may use the number of estimated error bits to calculate the second read voltage.

The controller 200A may transfer command and address signals for the second read operation, using the calculated second read voltage, to the first memory device 110A (S125). In response thereto, the first memory device 110A may perform the second read operation to transfer read data to the controller 200A (S126).

When the number of error bits estimated by the controller 200A exceeds a predetermined threshold value, the controller 200A may perform a read reclaim operation to execute a defense code. In an exemplary embodiment of the present inventive concept, the predetermined threshold value may be preset to be a value greater than 100 and less than 160, when the first memory device 110A is a multi-level cell (MLC).

Figure 16:
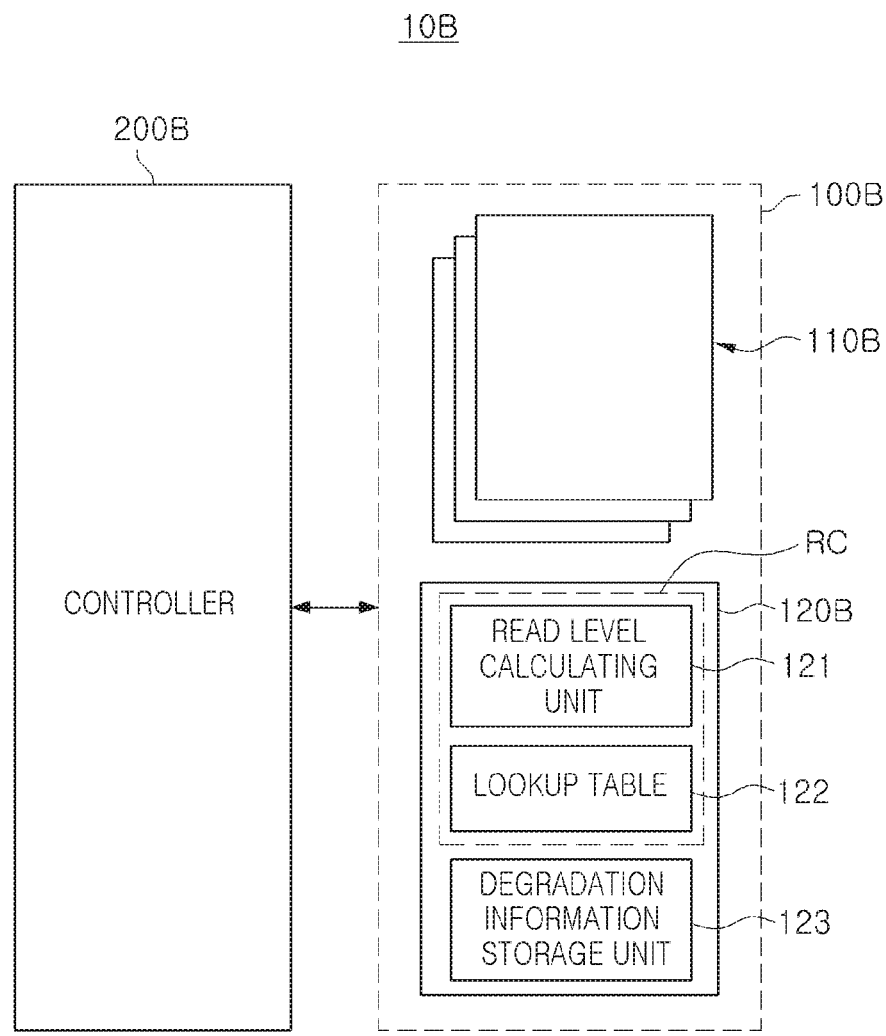
FIG. 16 is a view illustrating a storage device according to an exemplary embodiment of the present inventive concept.

FIG. 16 is a view illustrating a storage device according to an exemplary embodiment of the present inventive concept.

Referring to FIG. 16, a storage device 10B according to an exemplary embodiment of the present inventive concept may include a memory device 100B and a controller 200B.

The memory device 100B may include a first memory device 110B storing data requested by a host, and a second memory device 120B storing degradation information of the first memory device 110B. The first memory device 110B may include a single level cell (SLC) storing one bit of data, and a multi-level cell (MLC) storing two or more bits of data. In an exemplary embodiment of the present inventive concept, the first memory device 110B may include a quad level cell (QLC) capable of storing four or more bits of data in a single memory cell.

In an exemplary embodiment of the present inventive concept, the second memory device 120B may be a memory device having a different program and read operation unit from the first memory device 110B, and may include a resistive memory device such as a PRAM, an RRAM, an MRAM, or the like. In addition, in an exemplary embodiment of the present inventive concept, the second memory device 120B may be a memory device having a faster access speed than the first memory device 110B, and may include a next-generation memory device such as a Z-NAND flash memory.

The second memory device 120B may include a degradation information storage unit 123 for storing degradation information of the first memory device 110B. In an exemplary embodiment of the present inventive concept, degradation information stored in the second memory device 120B may include the number of error bits of the first memory device 110B, information about temperature of the first memory device 110B, information about P/E cycles of the first memory device 110B, information about intervals between an erase state and a program state of the first memory device 110B, or the like. A specific example of the degradation information storage unit 123 may be as described above with reference to FIG. 8.

The second memory device 120B may further include the read voltage controller RC for adjusting a read voltage for a target page using degradation information of the first memory device 110B.

The read voltage controller RC may include a read level calculating unit 121 and a lookup table 122.

The read level calculating unit 121 may receive existing degradation information from the degradation information storage unit 123, and may use the existing degradation information to estimate new degradation information that may occur in the target page when the read operation is performed. In an exemplary embodiment of the present inventive concept, the read level calculating unit 121 may change a reference number for the number of existing error bits used for the estimation of the number of error bits, according to a degradation rate of the target page to which the read operation is to be performed. For example, as described above with reference to FIG. 9A, when a degradation rate of the current page is relatively slow, the number of most recent error bits may be used to estimate the number of error bits. As described above with reference to FIG. 9B, when a degradation rate of the current page is relatively high, the read level calculating unit 121 may use the number of two recent error bits to estimate the number of error bits.

The read level calculating unit 121 may refer to the lookup table 122 using the number of estimated error bits, to calculate a read voltage suitable for the read operation. A specific example of the lookup table 122 may be substantially the same as described above with reference to FIGS. 13A to 13C.

Figure 17:
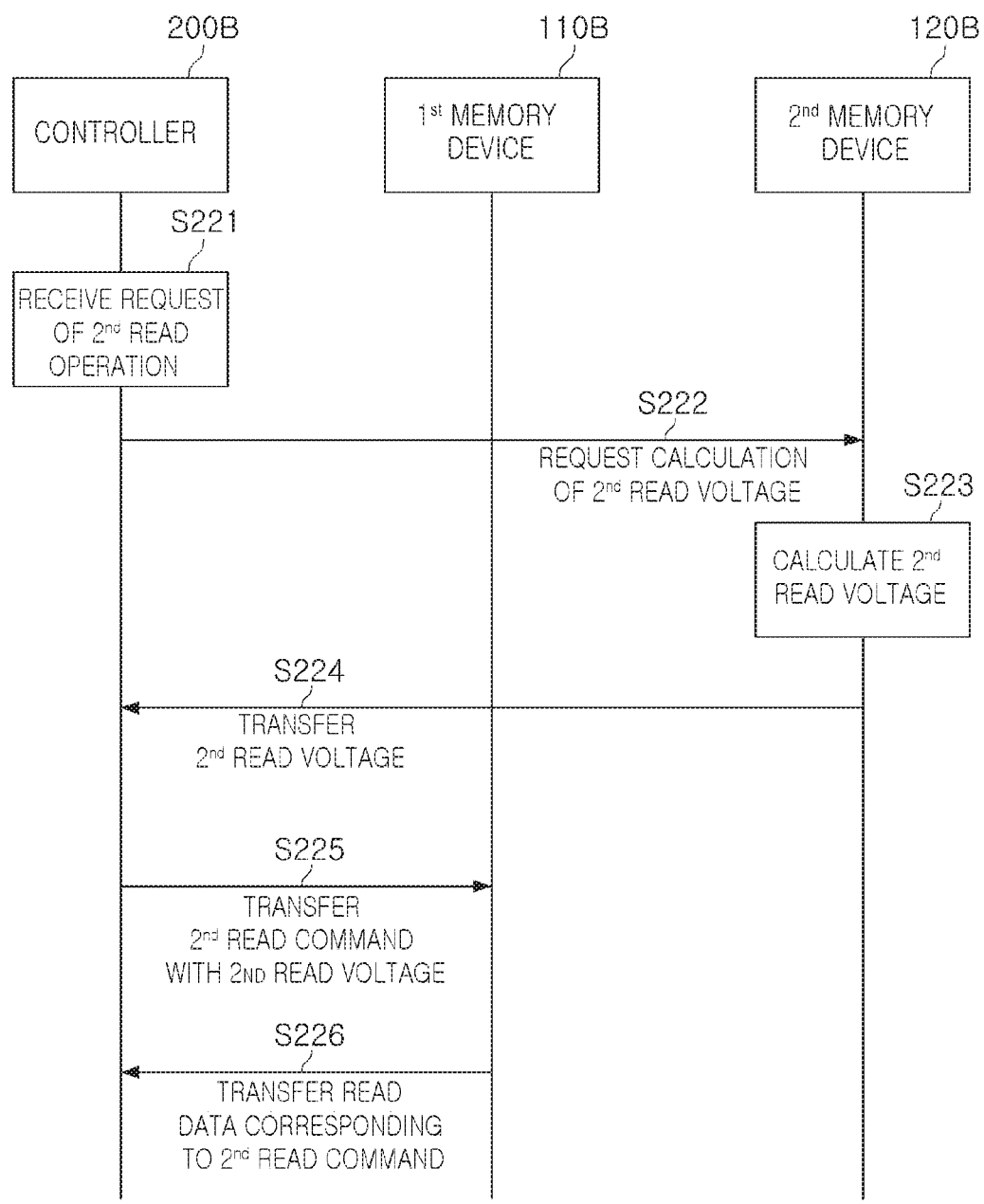
FIG. 17 is a view illustrating a method of operating the storage device of FIG. 16 according to an exemplary embodiment of the present inventive concept.

FIG. 17 is a view illustrating a method of operating the storage device of FIG. 16 according to an exemplary embodiment of the present inventive concept.

Referring to FIG. 17, the controller 200B may receive a request of a second read operation from the host (S221). The second read operation may be a read operation on data stored in the first memory device 110B.

The controller 200B may request the second memory device 120B to calculate a second read voltage, to perform the second read operation requested by the host (S222). In response thereto, the second memory device 120B may use the number of existing error bits and information about a group for degree of degradation in a target page on which the second read operation is to be performed, to calculate the second read voltage (S223). For example, the second memory device 120B may use received degradation information, to estimate the number of error bits that may occur when the second read operation is performed on the target page. The second memory device 120B may refer to the lookup table using the number of estimated error bits to calculate the second read voltage.

The second memory device 120B may transfer the calculated second read voltage to the controller 200B (S224). Thereafter, when the controller 200B transfers command and address signals for the second read operation to the first memory device 110B according to the received second read voltage (S225), the first memory device 110B may transfer read data corresponding to the second read operation to the controller 200B, in response thereto (S226). The received second read voltage may be transferred with the command and address signals for the second read operation (e.g., a second read command).

When the number of error bits estimated by the second memory device 120B exceeds a predetermined threshold value, the controller 200B may enter a defense code through a read retry operation. In an exemplary embodiment of the present inventive concept, the predetermined threshold value may be preset to be a value greater than 100 and less than 160, when the first memory device 110B is a multi-level cell (MLC).

Figure 18:
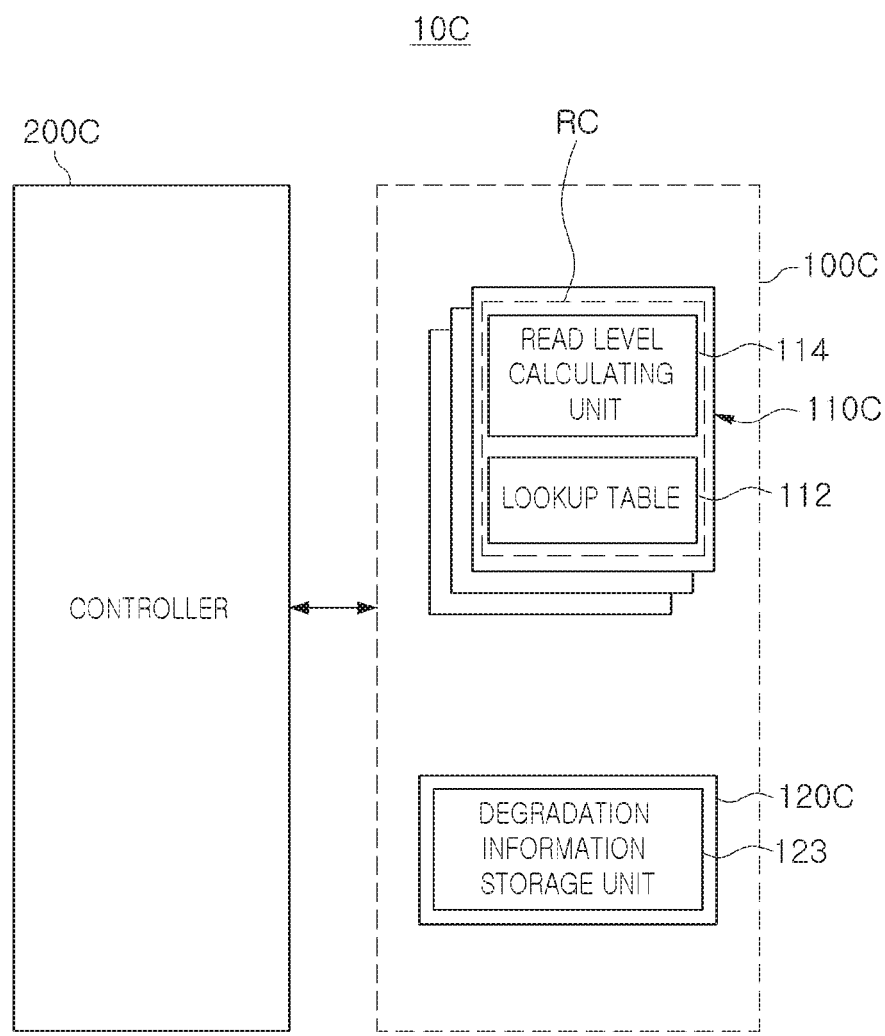
FIG. 18 is a view illustrating a storage device according to an exemplary embodiment of the present inventive concept.

FIG. 18 is a view illustrating a storage device according to an exemplary embodiment of the present inventive concept.

Referring to FIG. 18, a storage device 10C according to an exemplary embodiment of the present inventive concept may include a memory device 100C and a controller 200C.

The memory device 100C may include a first memory device 110C storing data requested by a host, and a second memory device 120C storing degradation information of the first memory device 110C. The first memory device 110C may include a single level cell (SLC) storing one bit of data, and a multi-level cell (MLC) storing two or more bits of data. In an exemplary embodiment of the present inventive concept, the first memory device 110C may include a quad level cell (QLC) capable of storing four or more bits of data in a single memory cell.

In an exemplary embodiment of the present inventive concept, the second memory device 120C may be a memory device having a different program and read operation unit from the first memory device 110C, and may include a resistive memory device such as a PRAM, an RRAM, an MRAM, or the like. In addition, in an exemplary embodiment of the present inventive concept, the second memory device 120C may be a memory device having a faster access speed than the first memory device 110C, and may include a next-generation memory device such as a Z-NAND flash memory.

The second memory device 120C may include the degradation information storage unit 123 for storing degradation information of the first memory device 110C. In an exemplary embodiment of the present inventive concept, degradation information stored in the second memory device 120B may include the number of error bits of the first memory device 110C, information about temperature of the first memory device 110C, information about P/E cycles of the first memory device 110C, information about intervals between an erase state and a program state of the first memory device 110C, or the like, obtained according to a patrol read operation.

The first memory device 110C may include the read voltage controller RC for adjusting a read voltage for a target page using degradation information.

The read voltage controller RC may include a read level calculating unit 114 and a lookup table 112.

The read level calculating unit 114 may receive existing degradation information from the degradation information storage unit 123, and may use the existing degradation information to estimate new degradation information that may occur in the target page when the read operation is performed. In an exemplary embodiment of the present inventive concept, the read level calculating unit 114 may change a reference number for the number of existing error bits used for the estimation of the number of error bits, according to a degradation rate of the target page on which the read operation is to be performed.

The read level calculating unit 114 may refer to the lookup table 112 using the number of estimated error bits, to calculate a read voltage suitable for the read operation.

Figure 19:
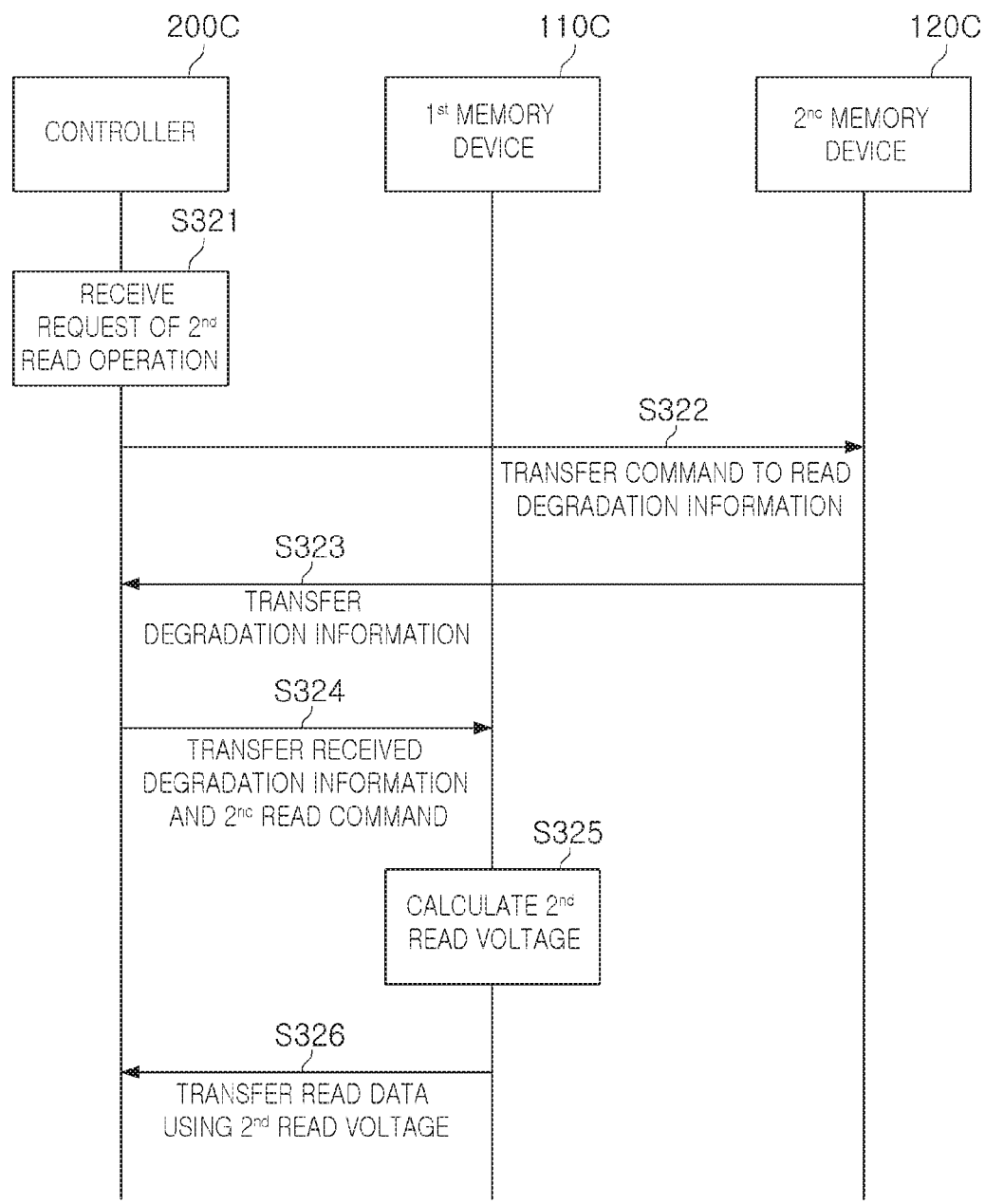
FIG. 19 is a view illustrating a method of operating the storage device of FIG. 18 according to an exemplary embodiment of the present inventive concept.

FIG. 19 is a view illustrating a method of operating the storage device of FIG. 18 according to an exemplary embodiment of the present inventive concept.

Referring to FIG. 19, the controller 200C may receive a request of a second read operation from the host (S321). The second read operation may be a read operation on data stored in the first memory device 110C.

The controller 200C may transfer a command for the second read operation for degradation information to the second memory device 120C, to perform the second read operation requested by the host (S322). In response thereto, the second memory device 120C may transfer the number of existing error bits and information about a group for degree of degradation in the target page for performing the second read operation to the controller 200C (S323).

The controller 200C may transfer degradation information received from the second memory device 120C to the first memory device 110C, together with command and address signals of the second read operation for the target page (S324). In response thereto, the first memory device 110C may use the received degradation information to calculate a second read voltage for the target page (S325). The first memory device 110C may use the calculated second read voltage to perform the second read operation for the target page, and as a result, may transfer read data to the controller 200C (S326).

When the number of error bits estimated by the first memory device 110C exceeds a predetermined threshold value, the controller 200C may enter a defense code through a read retry operation. In an exemplary embodiment of the present inventive concept, the predetermined threshold value may be preset to be a value greater than 100 and less than 160, when the first memory device 110C is a multi-level cell (MLC).

Figure 20:
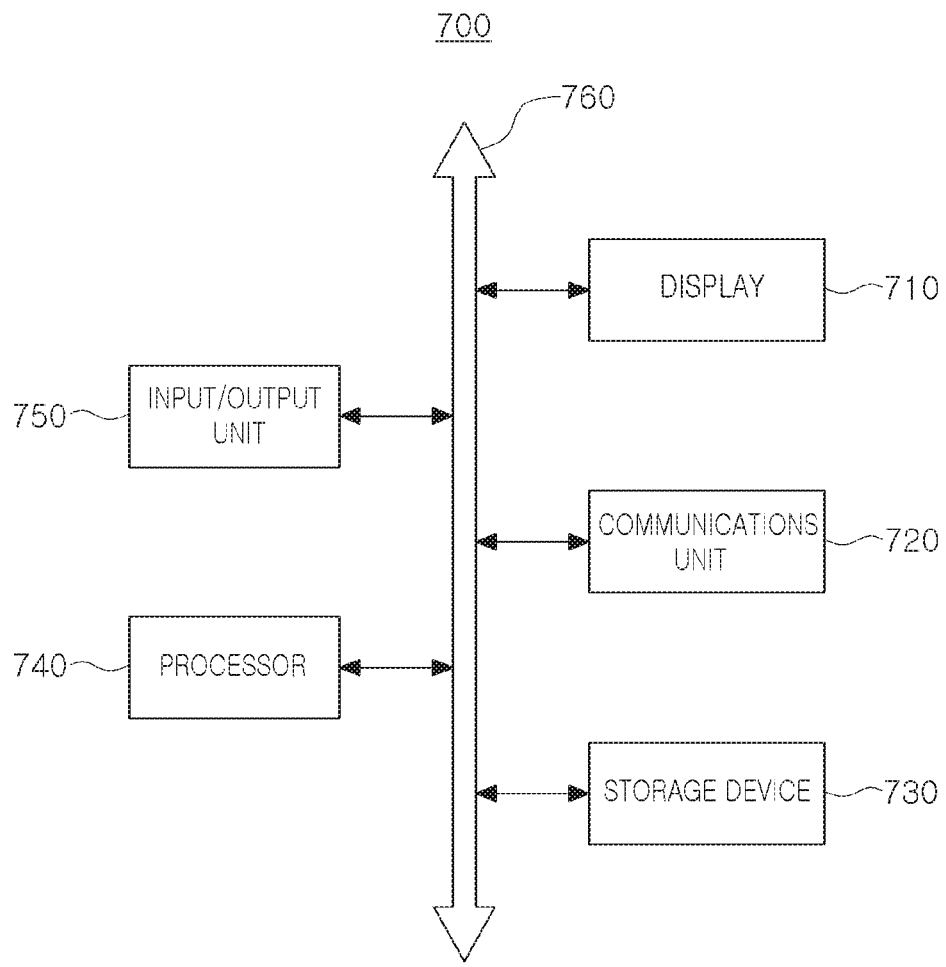
FIG. 20 is a view schematically illustrating an electronic device including a storage device according to an exemplary embodiment of the present inventive concept.

FIG. 20 is a block diagram schematically illustrating an electronic device including a storage device according to an exemplary embodiment of the present inventive concept.

An electronic device 700 according to the exemplary embodiment of the present inventive concept may include a display 710, a communications unit 720, a storage device 730, a processor 740, an input/output unit 750, and the like. Components such as the display 710, the communications unit 720, the storage device 730, the processor 740, the input/output unit 750, and the like may communicate with one another through a bus 760. In addition to the above-described components, the electronic device 700 may further include a power supply unit, a port, or the like.

The processor 740 may perform a specific operation, a command, a task, or the like. The processor 740 may be a central processing unit (CPU), a microprocessor unit (MCU), an application processor (AP), or the like, and may communicate with other components such as the display 710, the storage device 730, the input/output unit 750, and the like through the bus 760.

The storage device 730 included in the electronic device 700 may include a storage device according to exemplary embodiments of the present inventive concept. For example, the storage device 730 may operate according to exemplary embodiments described with reference to FIGS. 1 to 19. For example, the storage device 730 may have a hybrid structure including different types of first and second memory devices. The storage device 730 may store and manage various degradation information of the first memory device in the second memory device, accessible in byte units and having a relatively fast access speed. When there is a read request for the first memory device, the storage device 730 may calculate an optimal read voltage with reference to the degradation information stored in the second memory device, and may then use the calculated optimal read voltage to perform a read operation on the first memory device.

Storage devices according to exemplary embodiments of the present inventive concept may calculate an optimal read voltage using degradation information of a memory device to prevent occurrence of read failure.

Storage devices according to exemplary embodiments of the present inventive concept may have a hybrid structure in which heterogeneous memory devices are combined, to effectively control a level of a read voltage.

While the present inventive concept has been illustrated and described with reference to exemplary embodiments thereof, it will be apparent to those of ordinary skill in the art that modifications and variations in form and details could be made thereto without departing from the spirit and scope of the present inventive concept as set forth by the appended claims.

What is claimed is:

1. A storage device comprising:
a first memory device comprising a plurality of memory blocks, and a plurality of pages included in each of the plurality of memory blocks;
a second memory device configured to store first degradation information of the first memory device; and
a controller configured to perform a first read operation on the first memory device using a first read voltage, to acquire the first degradation information, and to perform a second read operation on the first memory device using a second read voltage,
wherein the second read voltage is calculated using second degradation information of the first memory device estimated using the first degradation information, and
each of the first degradation information and the second degradation information comprises the number of error bits of each of the plurality of pages,
wherein the controller is configured to change an amount of the number of error bits used to calculate the second degradation information, based on an increase rate in the number of error bits included in the first degradation information such that when a first increase rate is greater than a second increase rate, a larger number of errors bits is used to calculate the second degradation information for the first increase rate compared to the second increase rate.

2. The storage device of claim 1, wherein the controller is configured to change the amount of the number of error bits used to calculate the second degradation information, based on a possibility of occurrence of uncorrectable error correction code (UECC) existing in a target page in which the second read operation is performed, among the plurality of pages.

3. The storage device of claim 1, wherein the second memory device comprises a resistive memory device having a data processing unit smaller than a data processing unit of the first memory device.

4. The storage device of claim 1, wherein the controller is configured to calculate the second read voltage using a lookup table in which mapping information between the second degradation information and a read voltage correction value is stored.

5. The storage device of claim 1, wherein each of the first degradation information and the second degradation information further comprise degradation degree group information indicating a degradation degree of each of the plurality of pages.

6. The storage device of claim 5, wherein the degradation degree of each of the plurality of pages is classified as a plurality of steps according to the number of error bits generated in each of the plurality of pages.

7. The storage device of claim 1, wherein the second memory device comprises:

a first word line and a second word line extending in a first direction and spaced apart from each other in a third direction perpendicular to the first direction;

a bit line disposed between the first word line and the second word line and extending in a second direction perpendicular to the first and third directions;

a first memory cell disposed between the first word line and the bit line; and a second memory cell disposed between the bit line and the second word line, wherein each of the first and second memory cells comprises:

a first electrode, a second electrode, and a third electrode;

a storage element layer disposed between the first electrode and the second electrode and configured to store different data, depending on a resistance value of the storage element layer; and a selective element layer disposed between the second electrode and the third electrode and comprising an ovonic threshold switch (OTS) material.

8. The storage device of claim 1, wherein a period for performing the first read operation is set based on at least one piece of information among an increase rate of the error bits, a capacity of the first memory device, or a program/erase (P/E) cycle.

9. A storage device comprising:

a first memory device configured to store data requested by a host;

a second memory device configured to store first degradation information of the first memory device in page units; and a controller configured to perform a first read operation on the first memory device using a first read voltage, and to acquire the first degradation information, wherein the second memory device estimates second degradation information of the first memory device based on the first degradation information, and calculates a second read voltage, used to perform a second read operation on the first memory device according to a request of the host, based on the second degradation information, wherein the controller is configured to change an amount of the number of error bits used to calculate the second degradation information, based on a possibility of occurrence of uncorrectable error correction code (UECC) existing in a target page in which the second read operation is performed, among the plurality of pages such that when a first possibility of occurrence of UECC is greater than a second possibility of occurrence of UECC, a larger number of errors bits is used to calculate the second degradation information for the first possibility of occurrence of UECC compared to the second possibility of occurrence of UECC.

10. The storage device of claim 9, wherein the second read voltage is less than the first read voltage.

11. The storage device of claim 9, wherein the second memory device calculates the second read voltage using a lookup table in which mapping information between the second degradation information and a read voltage correction value is stored.

12. The storage device of claim 9, wherein each of the first degradation information and the second degradation information comprises the number of error bits of the first memory device.

13. The storage device of claim 12, wherein the controller is configured to perform a read reclaim operation on the first memory device, when the number of error bits of the first memory device included in the second degradation information exceeds a predetermined threshold value.

14. The storage device of claim 13, wherein the predetermined threshold value is greater than 100 and less than 160, when the first memory device is a multi-level cell (MLC).

15. A storage device comprising:

a first memory device configured to store data requested by a host;

a second memory device configured to store first degradation information of the first memory device; and a controller configured to detect the number of error bits generated by a first read operation on the first memory device as the first degradation information, wherein the first memory device estimates second degradation information of the first memory device, based on the first degradation information, in response to a request of a second read operation from the host, and uses a read voltage calculated based on the second degradation information to perform the second read operation, and a program unit of the second memory device is different from a program unit of the first memory device, wherein the second degradation information comprises results of comparing the number of error bits for a target page with a predetermined threshold value, wherein the first memory device uses the numbers of error bits at least one time stored in the second memory device to estimate the number of error bits generated by the second read operation, based on the results.

16. The storage device of claim 15, wherein the second degradation information comprises a change amount of the number of error bits for a target page.

17. The storage device of claim 15, wherein the first memory device uses the numbers of error bits at two or more recent times stored in the second memory device to estimate the number of error bits generated by the second read operation, when the number of error bits for the target page is greater than or equal to the predetermined threshold value.

18. The storage device of claim 15, wherein the first memory device uses the number of error bits at a most recent time in the second memory device to estimate the number of error bits generated by the second read operation, when the number of error bits for the target page is less than the predetermined threshold value.

* * * * *